(12) United States Patent
Cai et al.

(10) Patent No.: US 12,362,198 B2
(45) Date of Patent: Jul. 15, 2025

(54) INTERFACE TOOL AND METHODS OF OPERATION

(71) Applicant: Taiwan Semiconductor Manufacturing Company, Ltd., Hsinchu (TW)

(72) Inventors: Yu-Syuan Cai, Hsinchu (TW); Chen-Yuan Kao, Zhudong Township (TW); Chia-Han Lai, Zhubei (TW); Hong-Ming Wu, Taichung (TW); Yu-Chan Tsai, New Taipei (TW); Chun-Hsien Huang, Hsinchu (TW); Ken-Yu Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 504 days.

(21) Appl. No.: 17/662,106

(22) Filed: May 5, 2022

(65) Prior Publication Data

US 2023/0029508 A1   Feb. 2, 2023

Related U.S. Application Data

(60) Provisional application No. 63/203,769, filed on Jul. 30, 2021.

(51) Int. Cl.
*H01L 21/67* (2006.01)
*H01L 21/677* (2006.01)

(52) U.S. Cl.
CPC .. *H01L 21/67017* (2013.01); *H01L 21/67196* (2013.01); *H01L 21/67772* (2013.01)

(58) Field of Classification Search
CPC ......... H01L 21/67017; H01L 21/67196; H01L 21/67772; H01L 21/67778
(Continued)

(56) References Cited

U.S. PATENT DOCUMENTS

| 5,488,964 A * | 2/1996 | Murakami | ........ H01L 21/67051 134/155 |
| 6,537,949 B1 * | 3/2003 | Yamamoto | ......... H10N 60/0268 505/776 |
| 6,817,822 B2 * | 11/2004 | Tokunaga | ......... H01L 21/67772 414/217 |

(Continued)

FOREIGN PATENT DOCUMENTS

| KR | 20070049693 A | 5/2007 |
| KR | 20190143665 A * | 12/2019 |
| KR | 20200031185 A * | 3/2020 |

OTHER PUBLICATIONS

KR-20190143665-A English Translation of Specification (Year: 2024).*

(Continued)

*Primary Examiner* — Kenneth Rinehart
*Assistant Examiner* — Stephanie A Shrieves
(74) *Attorney, Agent, or Firm* — Harrity & Harrity, LLP

(57) ABSTRACT

Some implementations described herein provide a gas curtain system. The gas curtain system includes various components to prevent a gas flowing within a chamber of an interface tool from flowing through an opening into a transport carrier adjacent to the interface tool. The gas curtain system may include a gas distribution component along an edge of the opening that generates a flow of another gas across the opening towards an opposite edge of the opening. In this way, the gas from the chamber is prevented from entering the transport carrier. By preventing the gas from the chamber from entering the transport carrier, a relative humidity within an environment of the transport carrier is maintained such that condensation of moisture on one or more semiconductor wafers within the transport carrier is mitigated.

20 Claims, 19 Drawing Sheets

(58) Field of Classification Search
USPC .......................................................... 141/51
See application file for complete search history.

(56) References Cited

U.S. PATENT DOCUMENTS

| | | | | |
|---|---|---|---|---|
| 7,841,371 B2* | 11/2010 | Okabe | ............... | H01L 21/67772 |
| | | | | 414/217 |
| 10,276,415 B2* | 4/2019 | Kudo | ................ | H01L 21/67772 |
| 12,188,686 B2* | 1/2025 | Wu | ................... | H01L 21/68707 |
| 2002/0124906 A1* | 9/2002 | Suzuki | ............. | H01L 21/67366 |
| | | | | 141/98 |
| 2004/0105738 A1* | 6/2004 | Ahn | ....................... | H01L 21/00 |
| | | | | 414/935 |
| 2004/0168742 A1* | 9/2004 | Kim | ................. | H01L 21/67017 |
| | | | | 141/98 |
| 2009/0169342 A1* | 7/2009 | Yoshimura | ....... | H01L 21/67772 |
| | | | | 414/217 |
| 2015/0024671 A1* | 1/2015 | Taniyama | ........ | H01L 21/67772 |
| | | | | 454/193 |
| 2015/0214078 A1* | 7/2015 | Iwamoto | .......... | H01L 21/67772 |
| | | | | 454/305 |
| 2017/0170042 A1* | 6/2017 | Okabe | .............. | H01L 21/67393 |
| 2018/0047602 A1* | 2/2018 | Kawai | .............. | H01L 21/67775 |
| 2018/0286726 A1* | 10/2018 | Rebstock | ........... | G03F 7/70741 |
| 2019/0019719 A1* | 1/2019 | Atwood | ........... | H01L 21/67201 |
| 2020/0073258 A1 | 3/2020 | Chiu et al. | | |
| 2020/0234988 A1* | 7/2020 | Lin | ................... | H01L 21/67769 |
| 2021/0013078 A1* | 1/2021 | Kawai | .............. | H01L 21/67017 |
| 2021/0090923 A1* | 3/2021 | Woo | ............... | H01L 21/67098 |
| 2021/0402614 A1* | 12/2021 | Pavlik | ................... | B25J 9/1674 |

OTHER PUBLICATIONS

KR-20200031185-A English Translation of Specification (Year: 2025).*

* cited by examiner

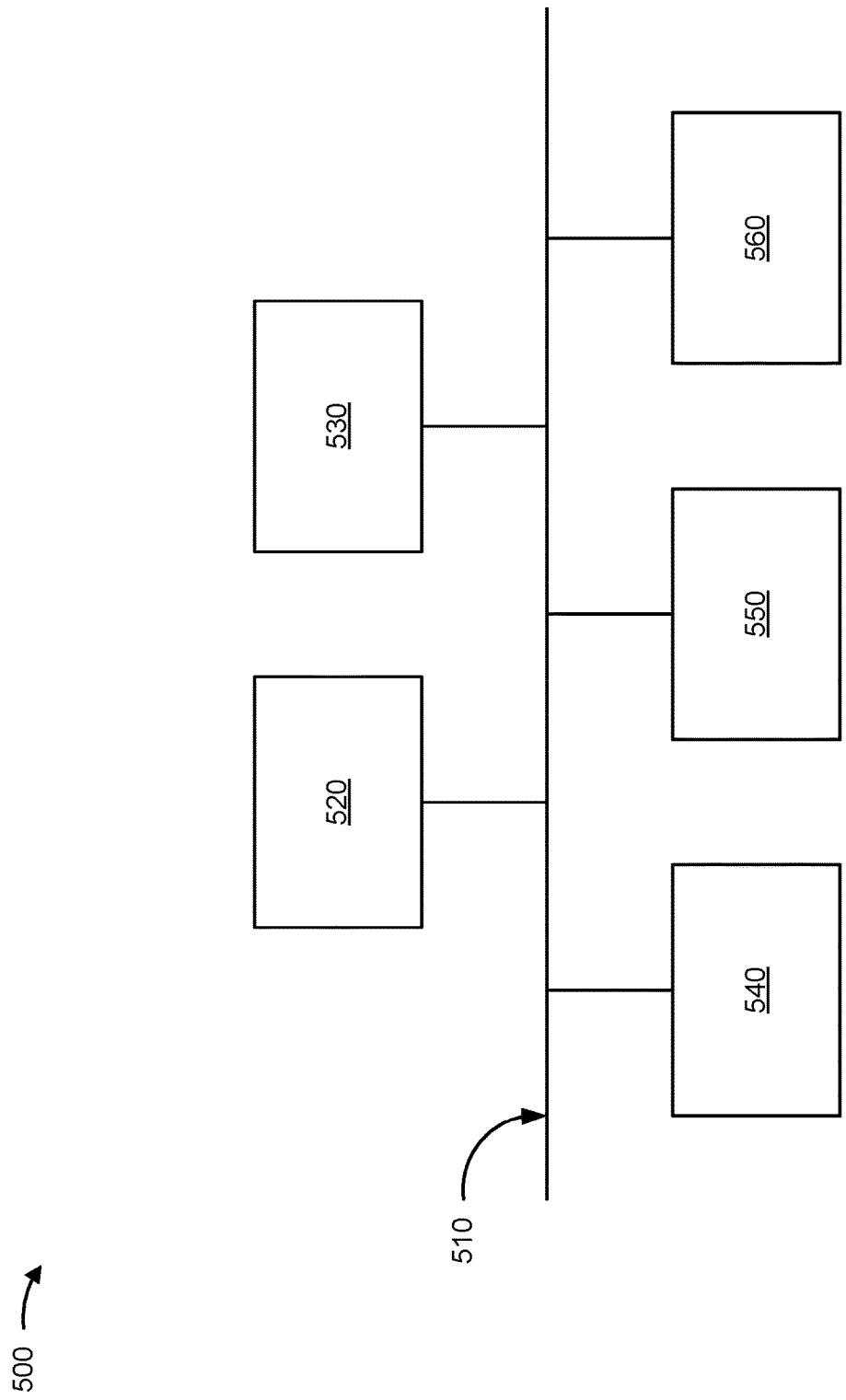

INTERFACE TOOL AND METHODS OF OPERATION

CROSS-REFERENCE TO RELATED APPLICATION

This Patent application claims priority to U.S. Provisional Patent Application No. 63/203,769 filed on Jul. 30, 2021, and entitled "Interface Tool and Methods of Operation". The disclosure of the prior Application is considered part of and is incorporated by reference into this Patent Application.

BACKGROUND

A semiconductor wafer may be processed in various processing tools in a semiconductor fabrication facility to produce various integrated circuits and/or semiconductor devices. A semiconductor wafer may be transported throughout the semiconductor fabrication facility and/or between the processing tools in the semiconductor fabrication facility.

A plurality of semiconductor wafers and/or other types of substrates may be transported throughout a semiconductor fabrication facility in a transport carrier. A transport carrier may include a wafer cassette, a front-opening unified pod (FOUP), a pod, a container, or a similar type of device. To transfer a semiconductor wafer from a transport carrier to a processing tool, the transport carrier may be placed in and/or on a load port associated with the processing tool. A transport tool included in an interface tool (e.g., an equipment front end module (EFEM) or similar type of interface tool) that is situated between the processing tool and the load port may remove the semiconductor wafer from the transport carrier. The transport tool may transfer the semiconductor wafer from the transport carrier to the processing tool through a chamber of the interface tool. The transport tool may perform the above-described process in reverse to transfer the semiconductor wafer from the processing tool to the transport carrier after processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a diagram of example components of one or more devices of FIGS. 1A-1C.

DETAILED DESCRIPTION

Figure 1A:
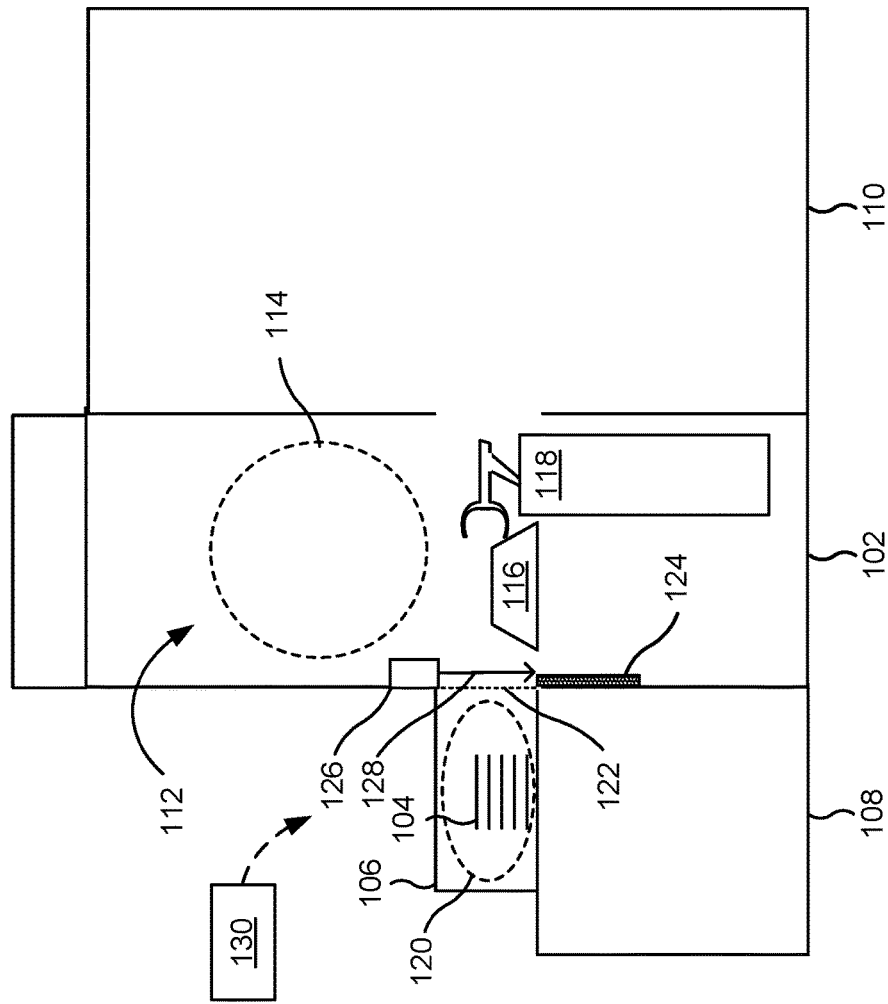
FIGS. 1A-1C are diagrams of an example semiconductor processing environment that includes a processing tool including a gas curtain system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a transport tool (e.g., a robot arm) included in an interface tool (e.g., an equipment front-end module (EFEM) or similar type of interface tool) situated between a processing tool and a load port may transfer semiconductor wafers between a transport carrier (e.g., a wafer cassette, a front-opening unified pod (FOUP), a pod, a container, or a similar type of device) and the processing tool (e.g., a deposition tool, an etch tool, among other examples.).

An environment within a chamber of the interface tool may be conditioned by providing a flow of a gas within the chamber to generate a positive pressure (e.g., positive relative to an environment external to the chamber) that assists maintaining cleanliness in the chamber of the interface tool (e.g., prevent particulates that may be in an environment surrounding the interface tool from entering the chamber). In some implementations, the gas may be provided to the chamber through a fan filter unit (FFU), which filters the gas prior to directing the gas downward into the chamber.

An example semiconductor wafer transfer operation by the interface tool may include the transport tool transferring a semiconductor wafer from the transport carrier, through the chamber, and to a processing tool such as a deposition tool (e.g., a cobalt deposition tool, a tungsten deposition tool, a copper deposition tool, among other examples). As part of performing the semiconductor wafer transfer operation, the interface tool may open a door of the transport carrier to enable the transport tool to perform the transfer (e.g., retrieve the semiconductor wafer from the transport carrier through an opening and present the semiconductor wafer to the processing tool). While the door is open, the gas from the chamber (e.g., air from the chamber having a high moisture content) may flow into the transport carrier.

In some cases, the gas provided by the FFU to the chamber of the interface tool may have a relatively high moisture content (e.g., relative to the moisture content in the transport carrier). As a result, when the gas from the chamber flows into the transport carrier, a relative humidity of an environment of the transport carrier may increase. The increased relative humidity in the transport carrier may cause moisture to condensate on semiconductor wafers within the transport carrier. The moisture condensation may cause defect formation (e.g., corrosion of a deposited metal) of integrated circuit devices (e.g., structures of the integrated circuit devices) on the semiconductor wafers either while staged within the transport carrier or during processing by the processing tool. Such defects may reduce manufacturing yield of the integrated circuit devices (e.g., time-zero yield), may cause the integrated circuit devices to be allocated to lower-tier markets (e.g., a market that uses integrated circuit devices with partial functionality), or may reduce a reliability of the integrated circuit devices during a field use (e.g., increase a failure in time (FIT) rate), among other examples.

Some implementations described herein provide a gas curtain system. The gas curtain system includes various components to prevent a gas flowing within a chamber of an interface tool from flowing through an opening into a transport carrier adjacent to the interface tool. The gas curtain system may include a gas distribution component along an edge of the opening that generates a flow of another gas across the opening towards an opposite edge of the opening. In this way, the gas from the chamber is prevented from entering the transport carrier. By preventing the gas from the chamber from entering the transport carrier, a relative humidity within an environment of the transport carrier is maintained such that condensation of moisture on one or more semiconductor wafers within the transport carrier is avoided, which minimizes and/or prevents corrosion during a processing of the semiconductor wafers by a processing tool such as a deposition tool.

Moreover, the gas curtain system may include a controller and one or more sensors to collect sensor data to automate one or more operating aspects of the gas curtain system, which may increase effectiveness of the gas curtain system, increase operating efficiency of the gas curtain system (and the interface tool), and increase a yield of product manufactured by a processing tool that receives semiconductor wafers from the interface tool.

Figure 1B:
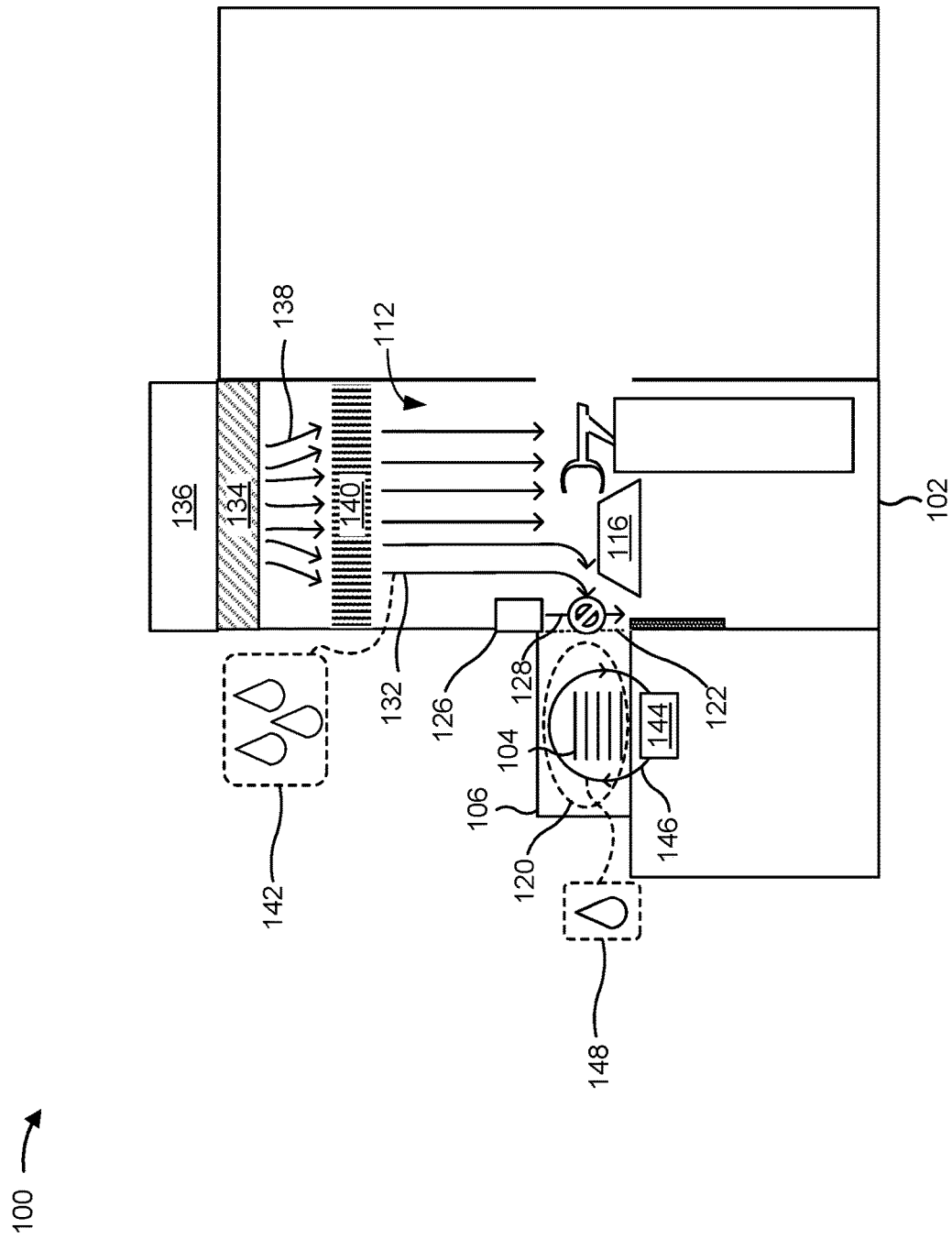
Figure 1C:
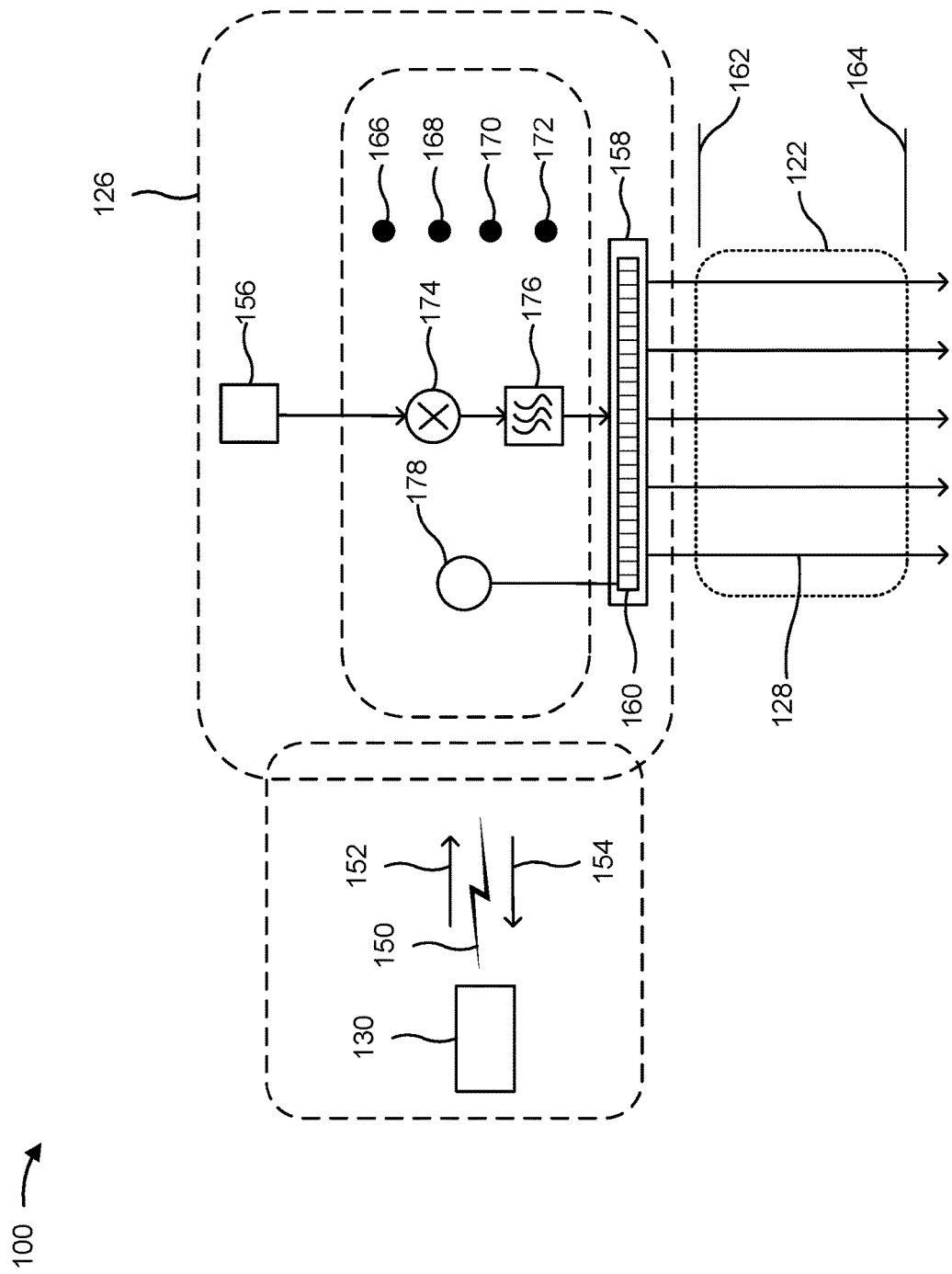

FIGS. 1A-1C are diagrams of an example semiconductor processing environment 100 that includes a processing tool including a gas curtain system described herein. The semiconductor processing environment 100 may include, or may be included in, a semiconductor fabrication facility, a semiconductor foundry, a semiconductor processing facility, a semiconductor clean room, and/or another environment in which semiconductor wafers and/or devices are processed. The semiconductor processing environment 100 may also include, or be included in, a factory floor of an original equipment manufacturer (OEM) of semiconductor tools.

FIG. 1A illustrates a cross-sectional view of the semiconductor processing environment 100. As shown in FIG. 1A, the semiconductor processing environment 100 includes an interface tool 102 configured to transfer a semiconductor wafer 104 between a transport carrier 106 supported on a load port 108 and a processing tool 110, among other tools and/or devices.

The semiconductor wafer 104 may be transferred directly into a processing area of the processing tool 110, may be transferred to a staging area of the processing tool 110, or may be transferred to another area of the processing tool 110. Additionally and/or alternatively, a semiconductor wafer 104 may be transferred from the processing tool 110 to the transport carrier 106.

The interface tool 102 includes a chamber 112 having an environment 114, an aligner 116 positioned at a location within the chamber 112, and a transport tool 118 (e.g., a robot arm or another type of transport tool) positioned at another location within the chamber 112. The environment 114 within the chamber 112 may have particular properties, such as a particular temperature (e.g., in degrees Celsius, or ° C.), a particular cleanliness (e.g., cleanroom classification corresponding to a quantity of particles of a particular size per cubic meter), and/or a particular relative humidity (e.g., RH %), among other examples. The aligner 116 and the transport tool 118 may be configured to perform one or more operations to align and transfer the semiconductor wafer 104 between the transport carrier 106 and the processing tool 110, including transporting the semiconductor wafer 104 through the chamber 112 and to the processing tool 110.

In some implementations, the aligner 116 changes an orientation of the semiconductor wafer 104 so that transport tool 118 provides semiconductor wafers 104 to the processing tool 110 in a consistent orientation. Such a consistent orientation may increase quality and yield. For example, if the processing tool 110 is a deposition tool, a consistent orientation of the semiconductor wafer 104 during a series of deposition processes (e.g., during creation of a multi-layer material stack) may reduce interlayer stresses that cause defects in structures of the semiconductor wafer 104. As another example, a consistent orientation for a plurality of semiconductor wafers 104 that are to be processed in a wafer lot may increase the repeatability and may increase the consistency of processing results for the plurality of semiconductor wafers 104.

The transport carrier 106 may include a wafer cassette, a FOUP, a pod, a container, or a similar type of device configured to hold and/or store a plurality of semiconductor wafers including the semiconductor wafer 104. An environment 120 within the transport carrier 106 may have certain properties, such as a particular temperature (e.g., in degrees Celsius, or ° C.), a particular cleanliness (e.g., cleanroom classification corresponding to a quantity of particles of a particular size per cubic meter), and/or a particular relative humidity (e.g., RH %), among other examples.

The transport carrier 106 may be positioned on the load port 108 adjacent to the chamber 112 to interface with an opening 122 in a side of the chamber 112. The load port 108 may receive the transport carrier 106 from a transport robot, a transport cart, an overhead hoist transport (OHT), or another device configured to move transport carriers to and from various locations in the semiconductor processing environment 100.

The transport carrier 106 includes a door 124 that, when open (or removed from the transport carrier 106) as shown in FIG. 1A, provides access for the transport tool 118 to transport the semiconductor wafer 104 through the opening 122. When closed (or when the door 124 is installed on the transport carrier 106), the door 124 may isolate the environment 120 of the transport carrier 106 from the environment 114 of the chamber 112 (e.g., prevent a flow of a gas from one environment to another, among other examples) and/or from the environment within the semiconductor processing environment 100.

In some implementations, the processing tool 110 includes a deposition tool (e.g., a processing tool configured to deposit one or more layers of a material such as tungsten, among other examples, onto the semiconductor wafer 104). In such an implementation, one or more processes performed by the processing tool 110 (e.g., a sputtering process, a chemical vapor deposition process, or a physical vapor deposition process that deposits the layer of the material onto the semiconductor wafer 104) may be sensitive to moisture on the semiconductor wafer 104 (e.g., water that condenses onto surfaces or metal layers of the semiconductor wafer 104 while the semiconductor wafer 104 is positioned in the transport carrier 106 prior to transfer of the semiconductor wafer 104 to the processing tool 110, among other examples). For example, moisture on the semiconductor wafer 104 may cause defects (e.g., corrosion or pitting, among other examples) during a tungsten deposition process performed by the processing tool 110. Such defects may decrease yield of semiconductor devices processed by the processing tool 110 and/or operating efficiencies of the processing tool 110.

In other implementations, the processing tool 110 includes a plating tool (e.g., an electroplating tool configured to deposit one or more metal layers onto the semiconductor wafer 104), an exposure tool (e.g., an extreme ultraviolet (EUV) tool, an electron beam (e-beam) tool), or etch tool (e.g., a wet etch tool, a dry etch tool), or another type of processing tool. Similar to the example implementation in which the processing tool 110 includes a deposition tool, processing of the semiconductor wafer 104 by each of these additional example implementations may be negatively impacted by moisture that has accumulated onto surfaces or metal layers of the semiconductor wafer 104.

The interface tool 102 includes a gas curtain system 126, which will be described in greater detail in relation to FIGS. 1B and 1C. When active, the gas curtain system 126 creates a barrier across the opening 122 to reduce a likelihood of a gas within the environment 114 from entering the environment 120. By reducing the likelihood of the gas within the environment 114 from entering the environment 120, the gas within the environment 114 is less likely to mix with another gas within the environment 120. In this way, one or more properties (e.g., a relative humidity, a temperature, an oxygen concentration, or a contamination level, among other examples) of the environment 120 may be maintained within particular ranges (or may be maintained to satisfy one or more thresholds) to prevent moisture accumulation on the semiconductor wafer 104.

The gas curtain system 126 is configured to generate a flow of a gas 128 across the opening 122, which provides the barrier across the opening 122. The flow of the gas 128 may include a mixture of one or more gases such as a dry air gas, an extreme clean dry air (XCDA) gas, a nitrogen ($N_2$) gas, a nitrogen-based gas, or another type of inert gas that resists chemically reacting with the materials that may be present on the semiconductor wafer 104, among other examples.

In some implementations, a mixture included in the flow of the gas 128 includes a total organic content such as a total organic carbon content that is in a range of approximately 1 part per billion to approximately 10 parts per billion. By selecting a total organic content within this range, a relative humidity within the environment 120 and or contamination within the environment 120 may be maintained below levels that reduce yield of the semiconductor wafer 104 during processing of the semiconductor wafer 104 by the processing tool 110. However, other values for the total organic content are within the scope of the present disclosure.

As shown in FIG. 1A, a controller 130 (e.g., a processor, a combination of a processor and memory, among other examples) is communicatively connected to the gas curtain system 126. The controller 130, or portions of the controller 130, may be included or distributed across the gas curtain system 126, the load port 108, the interface tool 102, and/or the transport carrier 106, among other examples.

The controller 130 may provide signals to the gas curtain system 126 to adjust settings of components of the gas curtain system 126 and/or to control one or more properties of the flow of the gas 128 based on one or more detected conditions. For example, the controller 130 may provide one or more signals to the gas curtain system 126 based on environmental properties detected within the environment 120 (e.g., a temperature, a relative humidity, an oxygen concentration, and/or a contamination level, among other examples). As another example, the controller 130 may provide one or more signals to the gas curtain system 126 based on a position of the door 124 (e.g., open, partially open, or closed, among other examples). As another example, the controller 130 may provide one or more signals to the gas curtain system 126 based on a position of the semiconductor wafer 104 (e.g., a detected position of the semiconductor wafer 104 as the semiconductor wafer 104 passes through the opening 122 during a transfer operation).

The flow of the gas 128 may inhibit, restrict, and/or reduce the likelihood of another gas from transferring from the environment 114 of the chamber to the environment 120 of the transport carrier 106. As is described in connection with FIG. 1B and elsewhere herein, inhibiting the gas from transferring from the environment 114 to the environment 120 reduces and/or prevents the likelihood of an increase in a relative humidity of the environment 120.

FIG. 1B illustrates a view of example gas flows within the semiconductor processing environment 100. A flow of a gas 132 is provided through the chamber 112 to prevent the ingress of humidity, oxygen, and/or contaminants (e.g., dust and other particles) from open areas of the semiconductor processing environment 100 external to the chamber 112. The flow of the gas 132 protects the semiconductor wafer 104 from contamination (or reduces the likelihood of contamination) during a transfer operation in which the semiconductor wafer 104 is transferred through the chamber 112.

In some implementations, and as illustrated in FIG. 1B, the flow of the gas 132 is generated by a fan filter unit (FFU) 134 (e.g., a fan or blower with a high-efficiency particulate air (HEPA) filter or another type of air filter) that draws in a gas from a plenum 136. The gas from the plenum 136 may be mixed with a gas 138 and provided through a rectifier 140 to create the flow of the gas 132. Additionally and/or alternatively, the FFU 134 may draw in the gas from an environment in the semiconductor processing environment 100.

In some implementations, the gas 138 corresponds to the gas from the plenum 136. In some implementations, the gas 138 corresponds to a gas circulating within the interface tool 102. In some implementations, the gas 138 includes one or more additional gases provided to the interface tool 102 by a gas supply system (e.g., a gas supply system may inject an XCDA or an $N_2$ gas near an exit of the FFU 134). In some implementations, the gas 138 includes a gas from an environment surrounding the interface tool 102 (e.g., air from an environment surrounding the interface tool 102 may flow into the interface tool 102 through openings, doors, or vents within the interface tool 102).

The flow of the gas 132 may include a closed-loop flow or an open-loop flow. As an example, and for a closed-loop flow, the interface tool 102 may be equipped with fans, pumps, and/or additional components that circulate the flow of the gas 132 within the interface tool 102 and return the flow of the gas 132 to the plenum 136. As another example, and for an open-loop flow, the interface tool 102 may be equipped with fans and/or vents that exhaust the flow of the gas external to the interface tool 102 (e.g., to the environment in the semiconductor processing environment 100 and/or external to the semiconductor processing environment 100).

In some implementations, the flow of the gas 132 includes one or more properties, such as a flow velocity (e.g., meters per second), a flow rate (e.g., liters per second), a Reynolds number indicating a degree of laminarity, and/or a direction of flow, among other examples. Moreover, the flow of the gas 132 may include a mixture having one or more properties such as a temperature, a cleanliness, and/or an amount of oxygen content, among other examples. Furthermore, and in some implementations, the gas 132 has a relatively high moisture content 142 (e.g., a greater amount of water vapor in comparison to a gas within the environment 120 of the transport carrier 106).

A gas system 144 circulates a flow of a gas 146 within the transport carrier 106. In some implementations, and as shown in FIG. 1B, the gas system 144 is integrated as part of the load port 108. In some implementations, the gas system 144 (including one or more subsystems of the gas system 144) is separate from the load port 108. In some implementations, the gas system 144 is integrated as part of the transport carrier 106.

The flow of the gas 146 that is circulated within the transport carrier 106 may include a mixture of one or more gases such as a dry air gas, an extreme clean dry air (XCDA) gas, a nitrogen ($N_2$) gas, a nitrogen-based gas, or another type of inert gas that resists chemically reacting with the materials that may be included on the semiconductor wafer 104. Properties of the flow of the gas 146 may depend on a type of gas or a mixture of gases used for the flow of the gas 146. For example, in an implementation in which an XCDA gas is used, the XCDA gas may include properties such as an oxygen ($O_2$) content that is less than approximately 21% and a relative humidity that is less than approximately 5%. In an implementation using an $N_2$ gas, the $N_2$ gas may include properties such as an $O_2$ that is less than approximately six parts per million (ppm) and a relative humidity that is less than approximately 1%. The flow of the gas 146 may include a relatively low moisture content 148 (e.g., a lesser amount of water vapor in comparison to the flow of the gas 132 within the environment 114 of the chamber 112).

The semiconductor wafer 104 may accumulate moisture from one or more mixtures of gases in the semiconductor processing environment 100. For example, and as shown in FIG. 1B, the position of the aligner 116 may cause the aligner 116 to deflect the flow of the gas 132 (e.g., the flow of the gas 132 having the relatively high moisture content 142) towards the opening 122. The flow of the gas 132 may pass through the opening 122 to mix with the flow of the gas 146 (e.g., the flow of the gas 146 having the relatively low moisture content 148) and increase the relative humidity of the environment 120. In these cases, moisture may accumulate (e.g., condense) on the semiconductor wafer 104.

Moisture that accumulates on the semiconductor wafer 104 may increase with a duration of time the semiconductor wafer 104 is within the environment 120 (e.g., while the semiconductor wafer 104 is staged within the transport carrier 106 stationed on the load port 108 and awaiting transfer and/or processing by the processing tool 110). As such, and for longer staging periods, maintaining the relative humidity within the environment 120 so that moisture does not condense on the semiconductor wafer 104 may avoid corrosion on the semiconductor wafer 104 while the semiconductor wafer 104 is within the environment 120 and also prevent manufacturing defects by the processing tool 110.

As shown in FIG. 1B, the flow of the gas 128 from the gas curtain system 126 impedes the flow of the gas 132 through the opening 122. To impede the flow of the gas 132 through the opening 122, the flow of the gas 128 may include one or more properties. For example, the flow of the gas 128 may include an approximately laminar flow (e.g., include a flow corresponding to a Reynolds (Re) number of less than approximately 2300 or another value). Configuring the gas curtain system 126 to provide the approximately laminar flow may increase the effectiveness of the flow of the gas 128 blocking the flow of the gas 132 through the opening 122 by reducing turbulence in the flow of the gas 128, for example.

As another example, the gas curtain system 126 may provide the flow of the gas 128 across the opening 122 at a flow rate that is in a range of approximately 325 liters per minute to approximately 375 liters per minute. As another example, the gas curtain system 126 may provide the flow of the gas 128 across the opening 122 at a pressure that is in a range of approximately 3 kilopascals to 5 kilopascals. Selecting respective properties of the flow of the gas 128 within one or more of these ranges may achieve a desired effectiveness of the flow of the gas 128 blocking the flow of the gas 132 through the opening 122, reducing turbulence, and preventing contamination on the semiconductor wafer 104. However, other values for the flow rate and the pressure are within the scope of the present disclosure.

The flow of the gas 128 across the opening 122 reduces a likelihood of the flow of the gas 132 from entering the transport carrier 106 and mixing with the flow of the gas 146. In this way, the relative humidity of the environment 120 within the transport carrier 106 may be maintained to satisfy one or more thresholds. Maintaining the relative humidity to satisfy a threshold that is in a range of approximately 0.0% to approximately 0.5% may reduce a likelihood of corrosion forming on the semiconductor wafer 104 during processing of the semiconductor wafer 104 by the processing tool 110.

FIG. 1C illustrates aspects of the controller 130 in communication with the gas curtain system 126 described herein. The controller 130 may communicate with one or more components of the gas curtain system 126 using one or more communication links 150 (e.g., one or more wireless-communication links, one or more wired-communication links, or a combination of one or more wireless-communication links and one or more wired-communication links).

Using the communication links 150, the gas curtain system 126 may transmit one or more signals 152 or receive one or more signals 154. The one or more signals 152 and 154 may include individual signals, combinations or sequences of signals, analog signals, digital signals, digital communications, voltages, resistances, currents, and/or other types of signals. The one or more signals 152 transmitted by the controller 130 may include, as examples, one or more indications to activate one or more components of the gas curtain system 126, one or more indications to adjust settings of one or more components of the gas curtain system 126, one or more indications to deactivate one or more components of the gas curtain system 126, among other examples. The one or more signals 154 received by the controller 130 may include sensor data associated with a condition of an environment (e.g., the environment 114 or the environment 120) and/or sensor data associated with a position or location of a component (e.g., a position or location of the door 124 or the semiconductor wafer 104), among other examples.

The gas curtain system 126 may include a combination of one or more components, including a gas source component 156 (e.g., a gas supply system such as an XCDA system or an $N_2$ system) that supplies the mixture of gas used for the flow of the gas 128 and a gas distribution component 158 that provides the flow of the gas 128 across the opening 122. In some implementations, the gas source component 156 includes a combination of valves and/or additional gas sources that allow the gas source component 156 to change a mixture of the flow of the gas 128. In some implementations, and as shown in FIG. 1C, the gas distribution component 158 includes a directional guide component 160 (e.g., a combination of one or more baffles, ports, rectifiers, and/or vents) that can change or adjust a direction of the flow of the gas 128, among other examples.

The gas distribution component 158 may be located along an approximate edge 162 of the opening and be configured to provide the flow of the gas 128 in an approximately linear path across the opening 122 towards another approximate edge 164 that is opposite the approximate edge 162. As described herein, the flow of the gas 128 may block another flow of a gas (e.g., the flow of the gas 132 originating from the FFU 134 and deflected towards the opening 122 by the aligner 116) to impede moisture from accumulating on a semiconductor wafer positioned in a transport carrier (e.g., the semiconductor wafer 104 positioned in the transport carrier 106) and reduce a likelihood of corrosion forming on the semiconductor wafer during processing of the semiconductor wafer by a processing tool (e.g., the processing tool 110).

The gas curtain system 126 may include a combination of one or more sensors that provide sensor data (e.g., transmit sensor data using the one or more signals 154) to the controller 130. Based on the sensor data, the controller 130 may activate the gas curtain system 126, deactivate the gas curtain system 126, or adjust a setting of one or more components of the gas curtain system 126, among other examples.

In some implementations, and as shown in FIG. 1C, the combination of one or more sensors includes a door position sensor 166 (e.g., an interrupt sensor or a linear position sensor, among other examples) that is configured to detect a position of a door (e.g., the door 124) or a transport carrier environment sensor 168 (e.g., a humidity sensor, a pressure sensor, or a thermocouple, among other examples) that is configured to detect one or more properties of an environment of a transport carrier (e.g., a relative humidity, a pressure, or temperature of the environment 120 of the transport carrier 106, among other examples). Additionally and/or alternatively, the controller 130 may be configured to detect the position of the door based on sensor data received from the door position sensor 166 and/or may be configured to detect the one or more properties of the environment in the transport carrier based on sensor data received from the transport carrier environment sensor 168.

The combination of one or more sensors may also include a chamber environment sensor 170 (e.g., a humidity sensor, a pressure sensor, or a thermocouple, among other examples) that is configured to detect one or more properties of a chamber (e.g., a relative humidity, a pressure, and/or a temperature of the environment 114 of the chamber 112, among other examples), or a semiconductor wafer position sensor 172 (e.g., an interrupt sensor, a linear position sensor, or a rotary position sensor integrated into the transport tool 118, among other examples) that is configured to detect a position of a semiconductor wafer (e.g., the semiconductor wafer 104 during a transfer operation). Additionally and/or alternatively, the controller 130 may be configured to detect the one or more properties of the chamber based on sensor data received from the chamber environment sensor 170 and/or may be configured to detect a position of the semiconductor wafer based on sensor data received from the semiconductor wafer position sensor 172.

The gas curtain system 126 shown in FIG. 1C may include a combination of one or more of a flow-rate component 174 (e.g., a valve or a fan, among other examples), a heater component 176 (e.g., a coil heater, among other examples), or a motor component 178 (e.g., a stepper motor or a servo motor, among other examples) that is mechanically coupled to the directional guide component 160. The flow-rate component 174 may increase or reduce a rate of flow of the gas 128. The heater component 176 may increase or decrease a temperature of the flow of the gas 128. The motor component 178 may change or adjust an orientation of baffles or ports within the directional guide component 160 to cause a change or an adjustment in a direction of the flow of the gas 128.

The controller 130 may be configured to transmit one or more indications in or using one or more of the signals 152 to the combination of the one or more components of the gas curtain system 126 to change one or more properties of the flow of the gas 128 based on sensor data received using the one or more signals 154.

For example, the controller 130 may be configured receive sensor data from the door position sensor 166 and determine, based on the sensor data, that a door of a transport carrier (e.g., the door 124 of the transport carrier 106) is in an open position and transmit, based on determining that the door of the transport carrier is in the open position, an indication to activate the gas curtain system 126 (e.g., open a port or valve of the gas source component 156, among other examples). Conversely, if the controller 130 determines that the door of the transport carrier is in a closed position, the controller 130 may transmit an indication to deactivate the gas curtain system 126.

As another example, the controller 130 may be configured to receive, from the transport carrier environment sensor 168, sensor data associated with a relative humidity of an environment within a transport carrier (e.g., the environment 120 within the transport carrier 106). The controller 130 may also be configured to receive, from the chamber environment sensor 170, sensor data associated with a relative humidity of an environment within a chamber (e.g., the environment 114 within the chamber 112). The controller 130 may be configured to determine to adjust a setting of one or more components of the gas curtain system 126 and transmit, based on determining to adjust the setting of one or more components of the gas curtain system 126, an indication to cause an adjustment to the setting of the one or more components. In some implementations, the controller 130 determining to adjust the setting is based on the sensor data associated with the relative humidity of the environment in the transport carrier and the sensor data associated with the relative humidity of the environment within the chamber (e.g., the relative humidity of the environment 114 within the chamber 112 being greater than the relative humidity of the environment 120 within the transport carrier 106). The indication to cause the adjustment of the one or more components may include an indication that causes an adjustment to a setting of the flow-rate component 174 to increase or decrease a velocity of the flow of the gas 128, an indication to cause an adjustment to a setting of the heater component 176 to increase or decrease a temperature of the flow of the gas 128, or an indication to cause an adjustment to a setting of the motor component 178 that changes angular positions of baffles within the directional guide component 160 to change a direction of the flow of the gas 128, among other examples. The adjustment to the one or more components may generate a high velocity, high temperature flow of the gas 128 to increase resistance to a high moisture content gas (e.g., the flow of the gas 132) and, for any portion of the high moisture content gas that may enter the opening 122, mix with the portion to dilute or lessen moisture content.

As another example, the controller 130 is configured to determine, based on sensor data from the transport carrier environment sensor 168 and the chamber environment sensor 170, that a difference in a relative humidity of each respective environment does not satisfy a threshold (e.g., the difference is approximately equal to or less than the threshold). In such an implementation, the controller 130 refrains from sending an indication to activate the gas curtain system 126 or to adjust a setting of one or more components of the gas curtain system 126.

Another example includes the controller 130 being configured to receive, from the semiconductor wafer position sensor 172, sensor data associated with a location of a wafer (e.g., a location of the semiconductor wafer 104 during a transfer operation). In some implementations, the semiconductor wafer position sensor 172 may be included as part of a transport tool (e.g., the transport tool 118).

The controller 130 may be configured to determine, based on the sensor data associated with the location of the semiconductor wafer, to adjust a setting of one or more components of the gas curtain system 126. The controller 130 may be further configured, based on determining to adjust the setting of one or more components, to transmit an indication to cause an adjustment to the setting of the one or more components. As an example, the controller 130 may determine that the semiconductor wafer is co-located with the flow of the gas 128 (e.g., in or passing through the opening 122) and transmit an indication to cause an adjustment to a setting of the flow-rate component 174 to reduce a velocity of the flow of the gas 128, an indication to cause an adjustment to a setting of the gas source component 156 to change a mix of the flow of the gas 128, or an indication to cause an adjustment to a setting of the heater component 176 to alter a temperature of the flow of the gas 128. In this example instance, the adjustment to the one or more components may create a low velocity, low moisture content, and high temperature flow of the gas 128 to heat the semiconductor wafer and evaporate condensed moisture from surfaces of the semiconductor wafer as the semiconductor wafer passes through the opening 122.

Another example includes the controller 130 being configured to receive sensor data from one or more sensors of the gas curtain system 126 (e.g., one or more of the door position sensor 166, the transport carrier environment sensor 168, the chamber environment sensor 170, or the semiconductor wafer position sensor 172). Based on the sensor data, the controller 130 may determine a correlation between a relative humidity of an environment within a transport carrier (e.g., a relative humidity of the environment 120 of the transport carrier 106) and one or more settings of one or more components of the gas curtain system 126 (e.g., one or more settings of one or more of the gas source component 156, the flow-rate component 174, the heater component 176, or the motor component 178, among other examples). The controller 130 may provide information relating to the correlation to update a machine-learning model that the controller 130 uses to estimate the relative humidity of the environment within the transport carrier for different settings of the one or more other components of the gas curtain system 126.

For a combination of operating conditions and/or parameters, the controller 130 may use the machine-learning model to estimate, based on environmental and/or gas flow conditions within a transport carrier (e.g., the transport carrier 106) or a chamber (e.g., the chamber 112), settings for one or more components of the gas curtain system 126 that prevent moisture condensation on a semiconductor wafer (e.g., the semiconductor wafer 104) within the transport carrier and/or corrosion during processing of the semiconductor wafer by a processing tool (e.g., the processing tool 110). The controller 130 may further use the machine-learning model to determine estimated probabilities (e.g., risk scores) for the moisture condensation and/or corrosion based on the settings of the one or more components and environmental conditions within a semiconductor processing environment (e.g., the semiconductor processing environment 100, including the environment 114 of the chamber 112 and the environment 120 of the transport carrier 106), properties of one or more gases within the semiconductor processing environment (e.g., the flow of the gas 128 from the gas curtain system 126, the flow of the gas 132 deflected by the aligner 116, or the flow of the gas 146 within the transport carrier 106), and/or a type of material layer on a semiconductor wafer (e.g., the semiconductor wafer 104) based on a production schedule, among other examples. Thus, the machine-learning model may be updated to improve an output of the machine-learning model.

As indicated above, FIGS. 1A-1C are provided as examples. Other examples may differ from what is described with regard to FIGS. 1A-1C. For example, another example may include additional components, fewer components, different components, or differently arranged components than those shown in FIGS. 1A-1C. Additionally, or alternatively, a set of components (e.g., one or more components) of FIGS. 1A-1C may perform one or more functions described herein as being performed by another set of components.

Figure 2A:
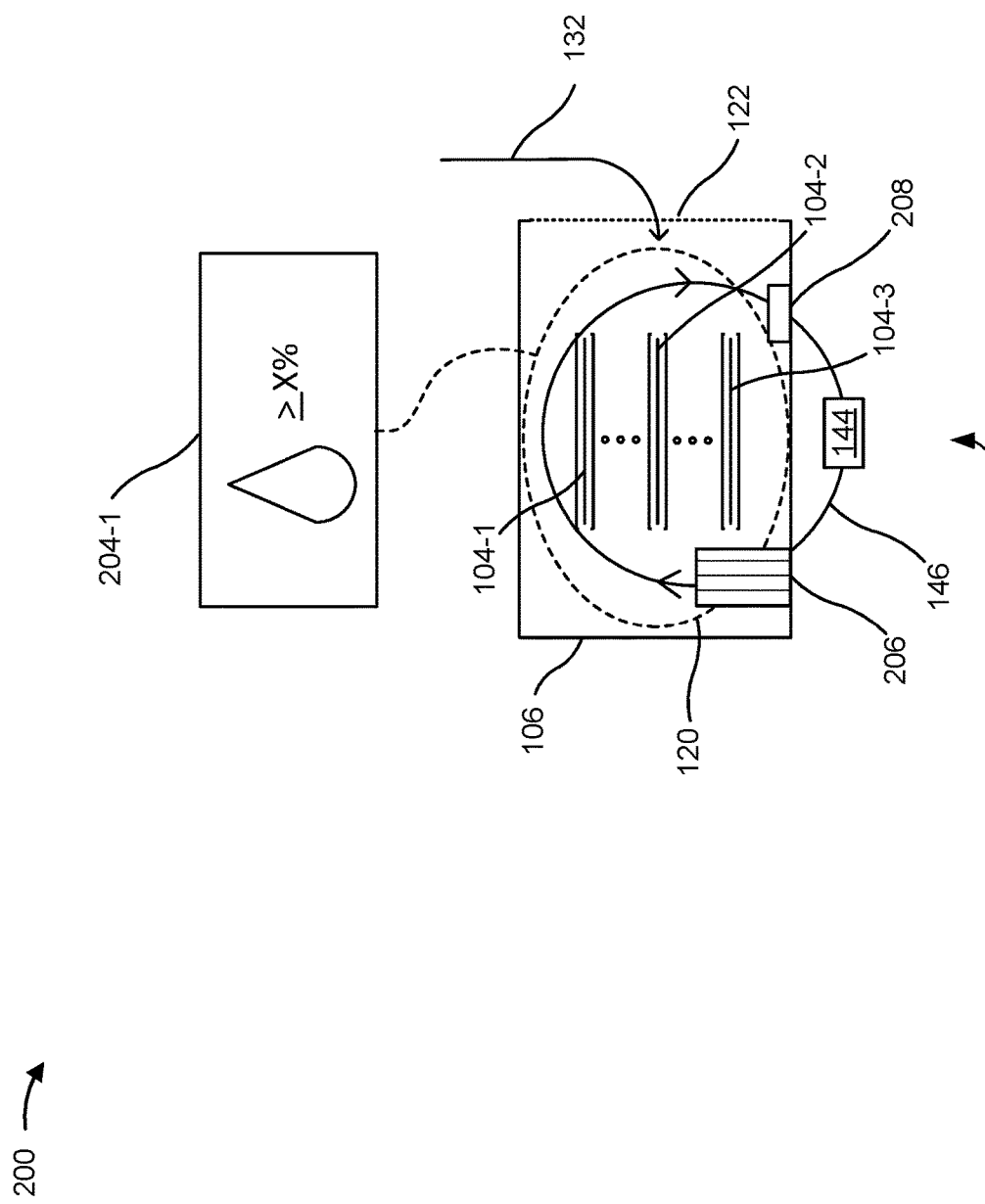
FIGS. 2A and 2B are diagrams of example implementations of a transport carrier described herein.
Figure 2B:
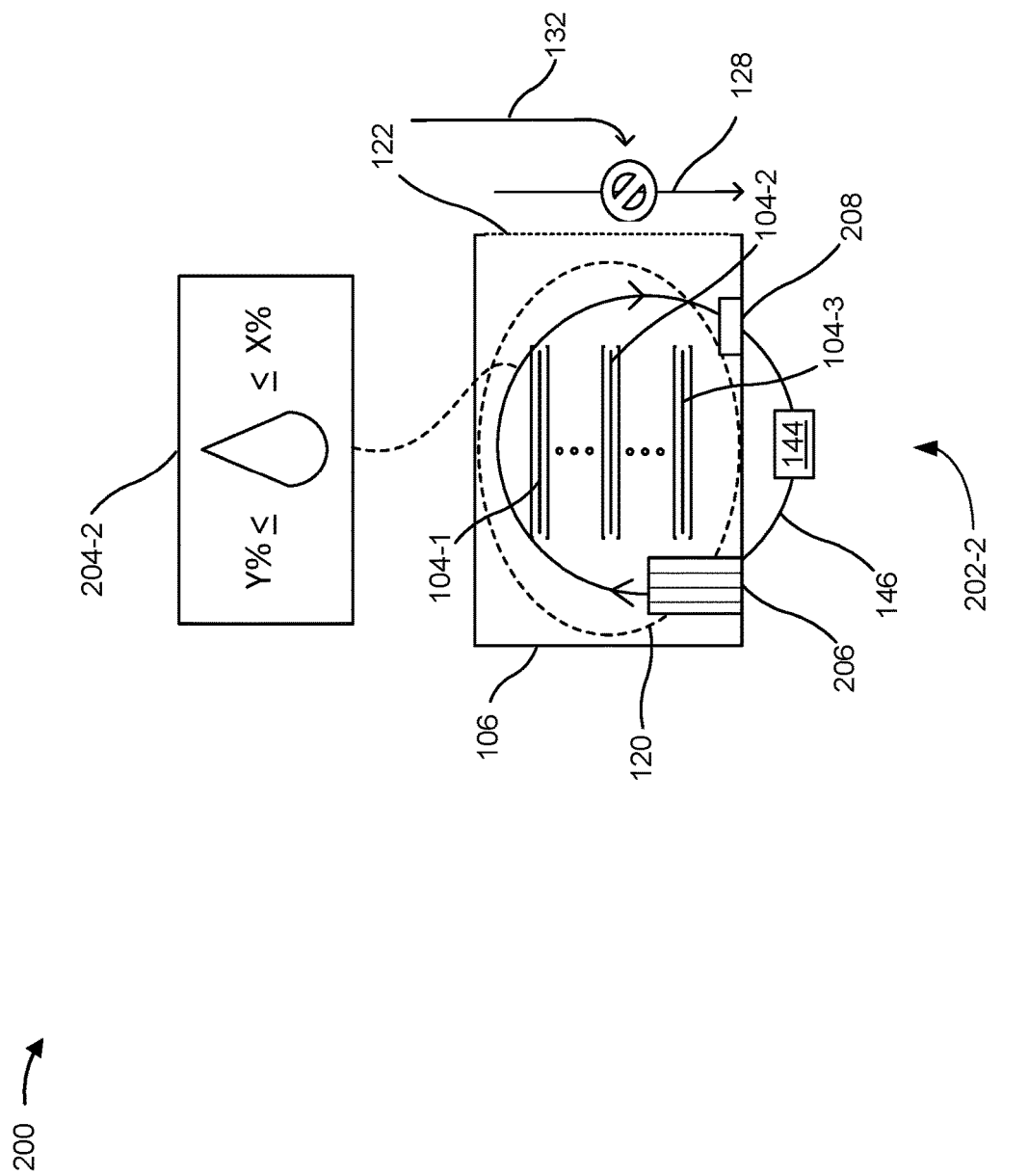

FIGS. 2A and 2B are diagrams of example implementations 200 of the transport carrier 106 described herein.

In FIG. 2A, example 202-1 shows the flow of the gas 132 entering the transport carrier 106 through the opening 122 and mixing with the flow of the gas 146 provided by the gas system 144. Due to a high moisture content of the flow of the gas 132 (e.g., the relatively high moisture content 142), a relative humidity of the environment 120 within the transport carrier 106 does not satisfy a threshold 204-1. As an example, the threshold may correspond to a relative humidity of approximately 0.5% (e.g., not satisfying the threshold corresponds to the relative humidity within the environment 120 being greater than or equal approximately 0.5%).

The threshold 204-1 may apply to one or more implementations of the semiconductor wafer 104 in different sub-regions within the transport carrier 106. For instance, the threshold 204-1 may apply to a semiconductor wafer 104-1 in a twenty-fourth slot of the transport carrier 106, a semiconductor wafer 104-2 in a thirteenth slot of the transport carrier 106, and a semiconductor wafer 104-3 in a first slot of the transport carrier 106.

In some implementations, and as shown in FIG. 2A, the transport carrier 106 includes a configuration that includes a diffuser 206 through which the flow of the gas 146 enters the transport carrier 106 and an outlet port 208 through which the flow of the gas 146 exits the transport carrier. This type of transport carrier 106 may be referred to as a "snorkel FOUP" or another type of FOUP that includes a diffuser 206 (e.g., a "snorkel").

Turning to FIG. 2B, example 202-2 shows the flow of the gas 128 (e.g., the flow of the gas 128 from the gas curtain system 126) blocking the flow of the gas 132 from entering the transport carrier 106 through the opening 122. As a result, a relative humidity of the environment 120 within the transport carrier 106 may be maintained to satisfy a threshold 204-2. As an example, the threshold may correspond to a relative humidity of approximately 0.0% to approximately 0.5% (e.g., satisfying the threshold corresponds to the relative humidity within the environment 120 being in a range from approximately 0.0% to approximately 0.5%). Maintaining the relative humidity to satisfy such a threshold may minimize or reduce a likelihood of corrosion on the semiconductor wafer 104 during a subsequent processing step (e.g., a deposition step performed by the processing tool 110). However, other values for the relative humidity are within the scope of the present disclosure.

The threshold 204-2 may apply to one or more instances of the semiconductor wafer 104 in different sub-regions within the transport carrier 106. For instance, the threshold 204-2 may apply to the semiconductor wafer 104-1 in the twenty-fourth slot of the transport carrier 106, the semiconductor wafer 104-2 in the thirteenth slot of the transport carrier 106, and the semiconductor wafer 104-3 in the first slot of the transport carrier 106.

In the context of FIGS. 2A and 2B, and in some implementations, the transport carrier 106 may be positioned on a load port (e.g., the load port 108) adjacent to a chamber (e.g., the chamber 112) of an interface tool (e.g., the interface tool 102), and a controller (e.g., the controller 130) may determine that one or more parameters associated with the environment 120 (e.g., a first environment) within the transport carrier 106 do not satisfy the threshold 204-2. Based on determining that the one or more parameters do not satisfy the threshold 204-2, the controller may determine one or more adjusted settings for a gas curtain system (e.g., the gas curtain system 126) included in the interface tool.

The controller may transmit an indication (e.g., the signal 152 including an indication) of the one or more adjusted settings to cause one or more properties of the flow of the gas 128 (e.g., a first flow of a first gas) from the gas curtain system across an opening between environment 120 within the transport carrier and an environment within the chamber (e.g., a second environment corresponding to the environment 114 in the chamber 112) to be adjusted such that the one or more parameters satisfy the threshold 204-2. In doing so, the flow of the gas 128 from the gas curtain system may impede a flow of another gas (e.g., a second flow of a second gas corresponding to the flow of the gas 132) from transferring from the second environment within the chamber to the first environment within the transport carrier to prevent an increase in humidity in the first environment within the transport carrier.

As indicated above, FIGS. 2A and 2B are provided as examples. Other examples may differ from what is described with regard to FIGS. 2A and 2B.

FIGS. 3A-3F are diagrams of an example implementation 300 described herein. The example implementation 300 includes an example of transferring a semiconductor wafer 104 between the load port 108 and the processing tool 110 (e.g., a chemical vapor deposition (CVD) processing tool, a physical vapor deposition (PVD) processing tool, or a photolithography processing tool, among other examples). The example implementation 300 includes one or more processes performed by an interface tool (e.g., the interface tool 102) including a gas curtain system (e.g., the gas curtain system 126).

As described herein, the example implementation 300 may include the interface tool determining that a door (e.g., the door 124) of a transport carrier (e.g., the transport carrier 106) has been opened, where the transport carrier is located on a load port (e.g., the load port 108) and interfaced with an opening (e.g., the opening 122) in a side of a chamber (e.g., the chamber 112) of the interface tool. In the example implementation 300, a first gas (e.g., the flow of the gas 146) provided by a first gas system (e.g., the first gas system 144) has a first amount of moisture content (e.g., the relatively low moisture content 148) and circulates within the transport carrier.

The example implementation 300 further includes providing, by a second gas system (e.g., the gas curtain system 126) of the interface tool based on determining that the door of the transport carrier has been opened, a second gas (e.g., the flow of the gas 128) across the opening. In some implementations, the second gas originates along a first approximate edge (e.g., the approximate edge 162) of the opening and flows across the opening in an approximately linear path towards a second approximate edge (e.g., the approximate edge 164) of the opening that is opposite the first approximate edge. The flow of the gas may reduce a likelihood of a third gas flowing within the chamber of the interface tool (e.g., the flow of the gas 132 within the chamber 112 of the interface tool 102) and having a second amount of moisture content that is greater than the first amount of moisture content (e.g., the relatively high moisture content 142 that is greater than the relatively low moisture content 148) from entering the transport carrier and mixing with the first gas so that a relative humidity of an environment (e.g., a relative humidity of the environment 120) satisfies a threshold (e.g., the threshold 204-2).

Figure 3A:
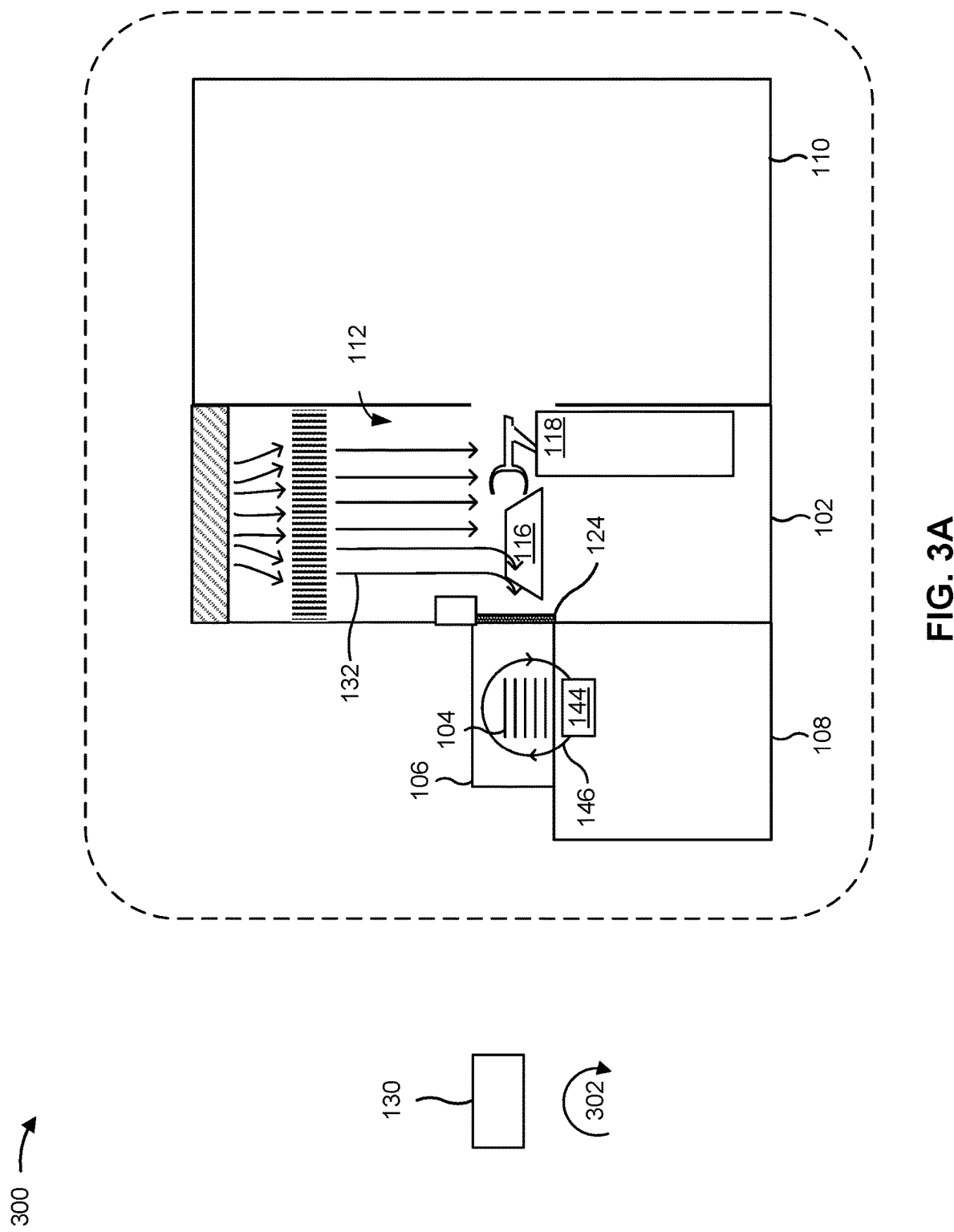
FIGS. 3A-3F and 4A-4E are diagrams of example implementations described herein.

Turning to FIG. 3A, the controller 130 may perform a process 302 corresponding to an initialization process. As shown in FIG. 3A, the transport carrier 106 including the semiconductor wafer 104 is located on the load port 108. The flow of the gas 146 (e.g., the flow of the gas 146 having the relatively low moisture content 148) circulates within the transport carrier 106. Within the chamber 112, the aligner 116 deflects the flow of the gas 132 (e.g., the flow of the gas 132 having the relatively high moisture content) towards the door 124 of the transport carrier.

Figure 3B:
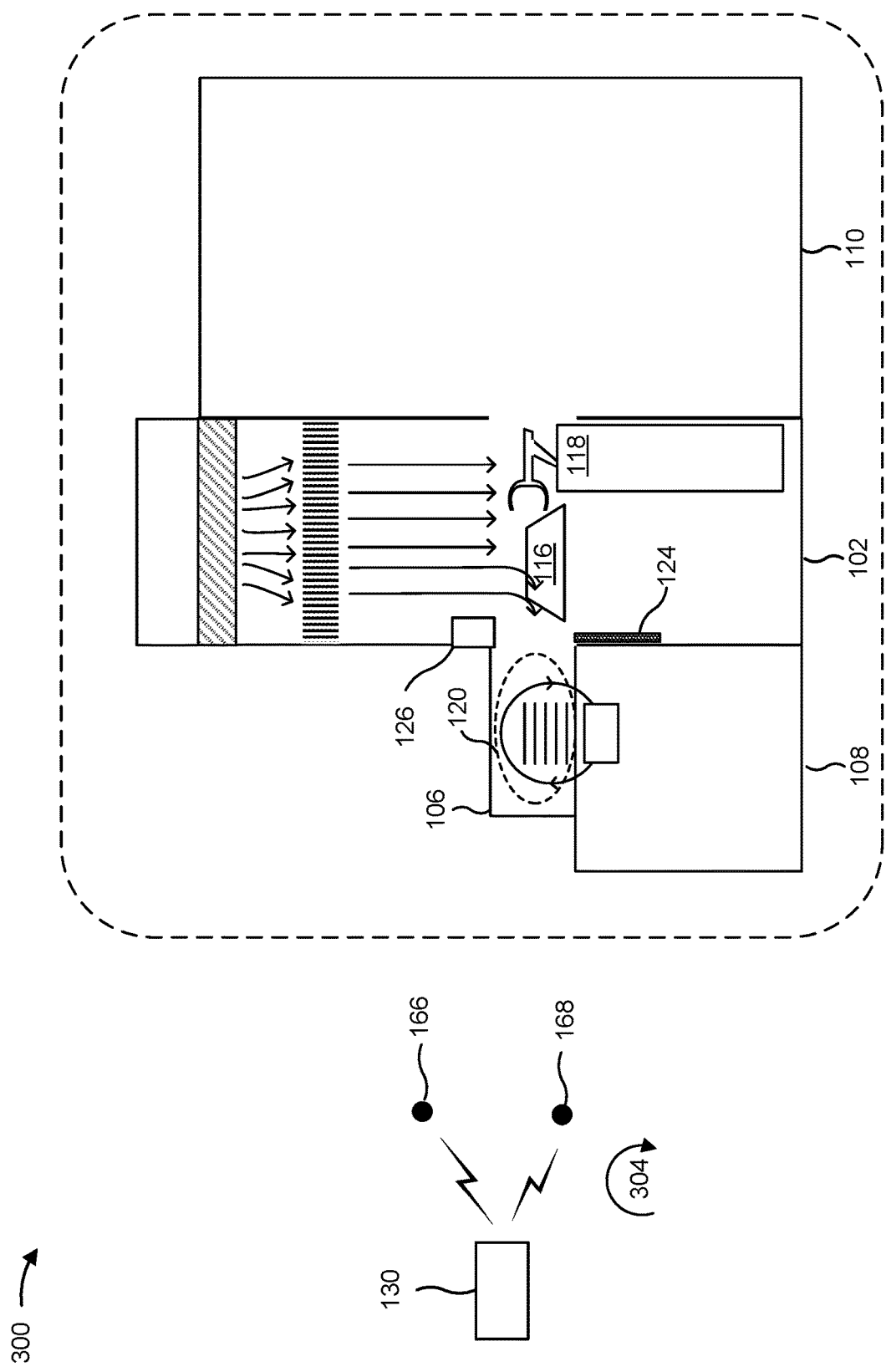

As shown in FIG. 3B, the controller 130 performs a process 304 that includes receiving sensor data from the door position sensor 166. Based on the data, the controller 130 determines that the door 124 is in an open position. The process 304 may further include, as shown in FIG. 3B, the controller 130 receiving sensor data from the transport carrier environment sensor 168 and determining that a relative humidity of the environment 120 satisfies a threshold (e.g., is approximately equal to or greater than the threshold). The sensor data from the door position sensor 166 and/or the sensor data from the transport carrier environment sensor 168 is received by the controller 130 using the one or more communication links 150.

Figure 3C:
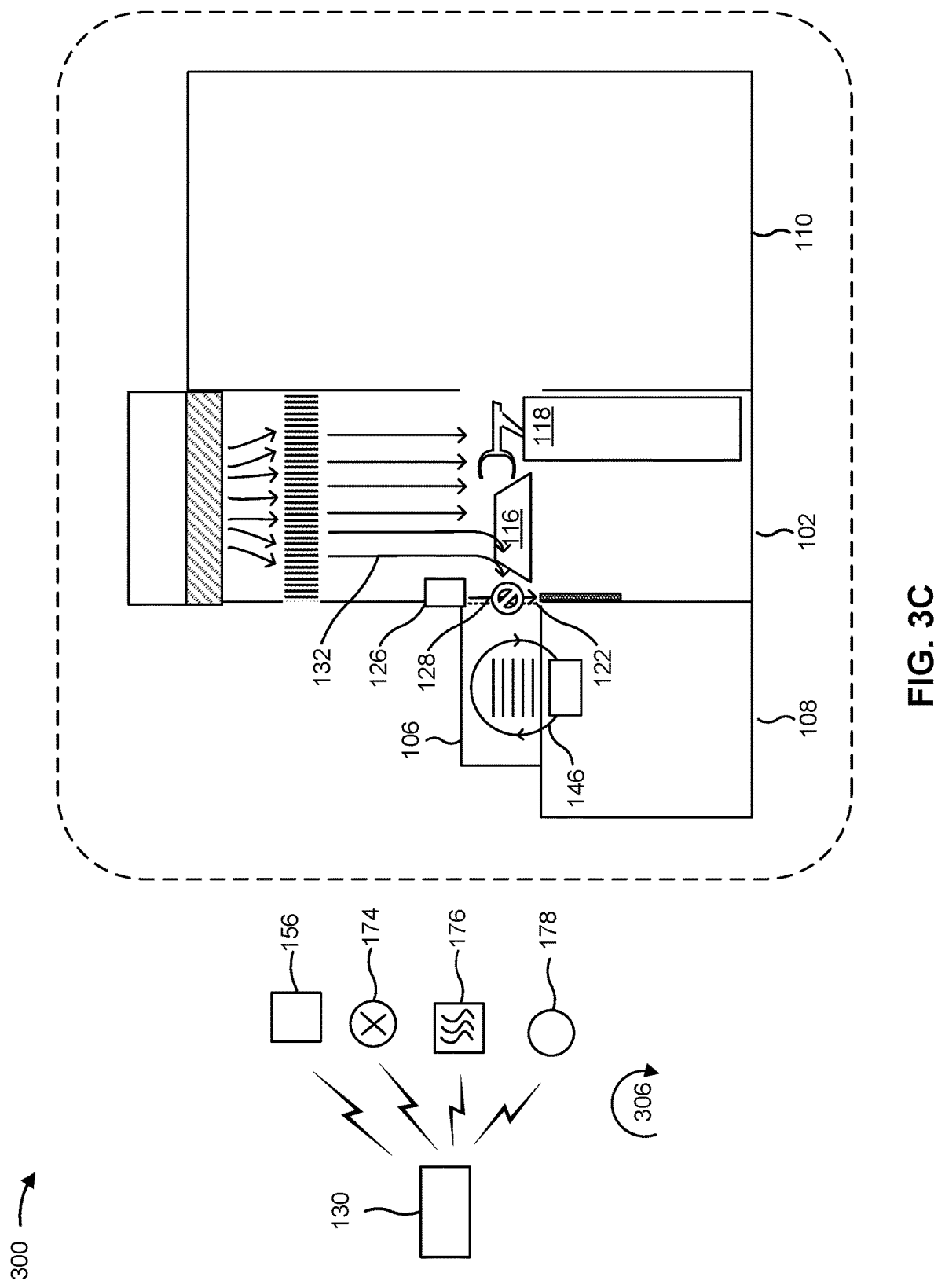

Based on one or more determinations made at process 304, and as part of process 306 shown in FIG. 3C, the controller 130 may communicate with one or more components of the gas curtain system 126 to activate the gas curtain system 126 and provide the flow of the gas 128 across the opening 122 and to block the flow of the gas 132 from entering the opening 122. Activating the gas curtain system 126 in process 306 may include, for example, the controller 130 transmitting an indication (e.g., the signal 152 including an indication) to adjust a setting of one or more of the gas source component 156, the flow-rate component 174, the heater component 176, or the motor component 178 such that the flow of the gas 128 includes certain properties (e.g., a flow having a velocity, a flow having a flow rate, or a mixture having a temperature, a cleanliness, or an amount of oxygen content, among other examples). In this example, the properties may include a high velocity flow of the gas 128 to increase resistance to the flow of the gas 132 entering the opening 122 and mixing with the flow of the gas 146.

Figure 3D:
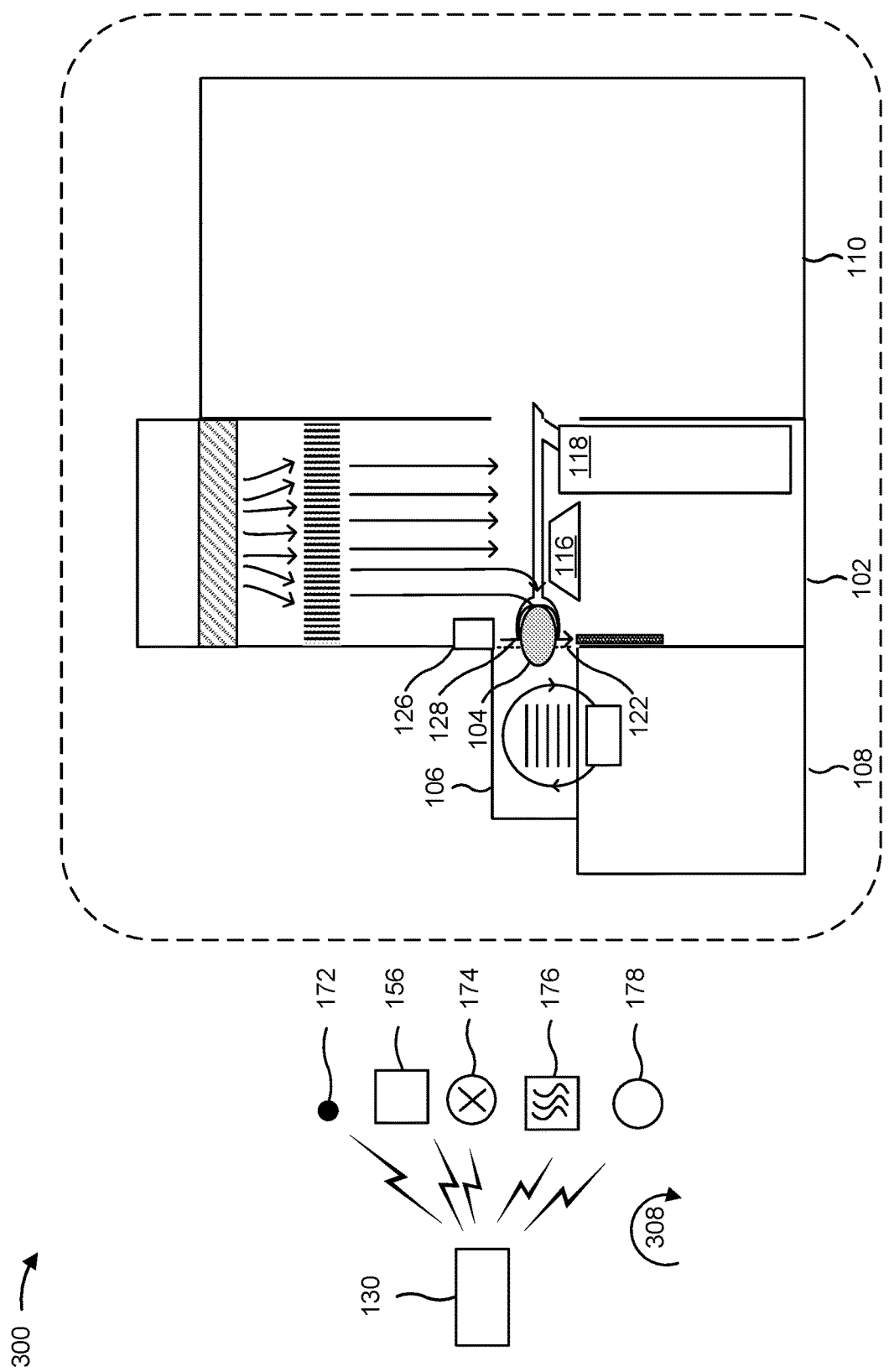

Turning to FIG. 3D, the controller 130 may perform a process 308 that changes properties of the flow of the gas 128 during a transfer of the semiconductor wafer 104 by the transport tool 118 (e.g., as shown in FIG. 3D, the transport tool 118 is retrieving the semiconductor wafer 104 from the transport carrier 106 to transfer the semiconductor wafer 104 to the processing tool 110).

During the retrieval of the wafer, the controller 130 may perform the process 308 that includes receiving sensor data from the semiconductor wafer position sensor 172 and, based on the sensor data, determining that the semiconductor wafer 104 is passing through the opening 122 (e.g., a location of the semiconductor wafer 104). Based on determining that the semiconductor wafer 104 is passing through the opening 122, and as part of the process 308, the controller 130 may further transmit an indication (e.g., the signal 152 including an indication) to adjust a setting of one or more of the gas source component 156, the flow-rate component 174, the heater component 176, or the motor component 178 such that the flow of the gas 128 includes certain properties (e.g., a flow having a velocity, a flow having a flow rate, or a mixture having a temperature, a cleanliness, or an amount of oxygen content, among other examples). In this example, the properties may include a high temperature flow of the gas 128 to heat the semiconductor wafer 104 and evaporate condensed moisture from surfaces of the semiconductor wafer 104 as the semiconductor wafer 104 passes through the opening 122.

Figure 3E:
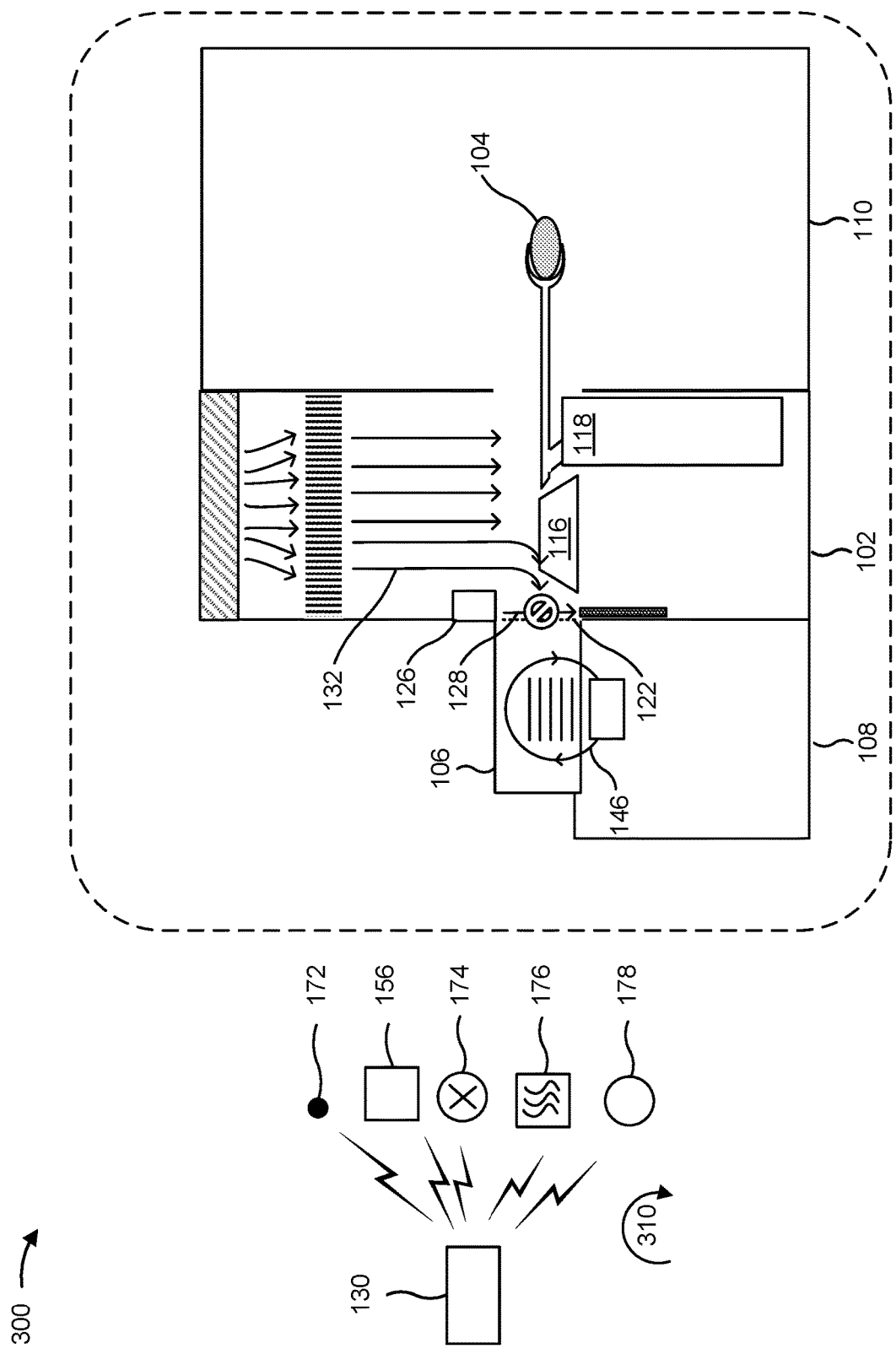

FIG. 3E shows the transport tool 118 completing the transfer of the semiconductor wafer from the transport carrier 106 to the processing tool 110. In FIG. 3E, and as part of a process 310, the controller 130 may receive sensor data from the semiconductor wafer position sensor 172 and, based on the sensor data, determine that that the transfer is complete. Based on determining that the transfer is complete, and as part of the process 310, the controller 130 may further transmit an indication (e.g., the signal 152 including an indication) to adjust a setting of one or more of the gas source component 156, the flow-rate component 174, the heater component 176, or the motor component 178 such that the flow of the gas 128 includes certain properties (e.g., a flow having a velocity, a flow having a flow rate, or a mixture having a temperature, a cleanliness, or an amount of oxygen content, among other examples). In this example, the properties may include a high velocity flow of the gas 128 to increase resistance to the flow of the gas 132 entering the opening 122 and mixing with the flow of the gas 146.

Figure 3F:
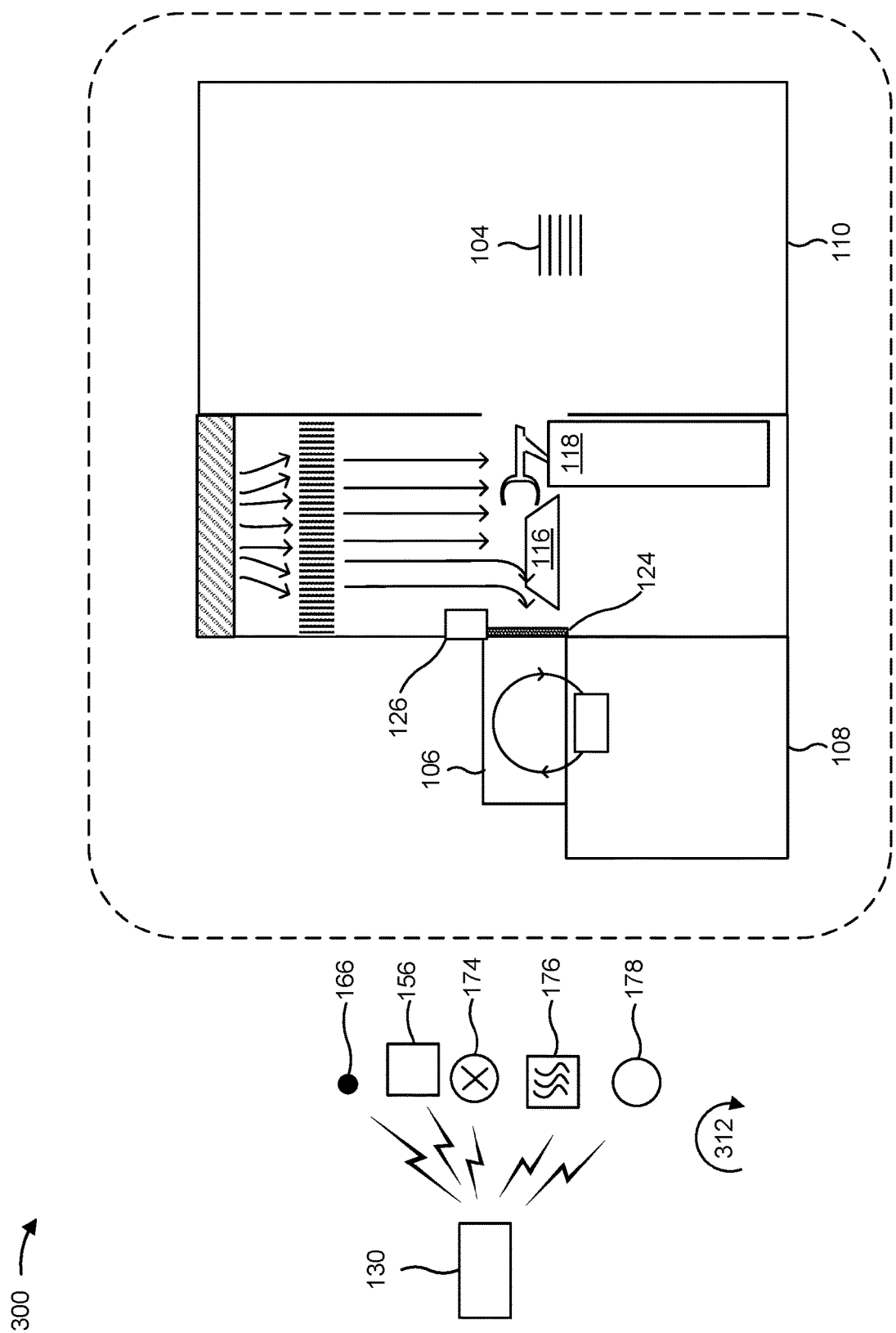

As shown in FIG. 3F, the transport tool 118 has completed transferring one or more of the semiconductor wafers 104 from the transport carrier 106 to the processing tool 110. In FIG. 3F, and as part of a process 312, the controller 130 receives sensor data from the door position sensor 166. Based on the data, the controller 130 determines that the door 124 is in a closed position.

The process 312 may further include the controller 130 determining, based on the closed position of the door 124, to deactivate the gas curtain system 126. To deactivate the gas curtain system 126, the controller 130 may transmit an indication (e.g., the signal 152 including an indication) to adjust a setting of one or more of the gas source component 156, the flow-rate component 174, the heater component 176, or the motor component 178 such that the flow of the gas 128 is stopped.

As indicated above, FIGS. 3A-3F are provided as examples Other examples may differ from what is described with regard to FIGS. 3A-3F. For example, another example may include additional components, fewer components, different components, or differently arranged components than those shown in FIGS. 3A-3F. Additionally, or alternatively, a set of components (e.g., one or more components) of FIGS. 3A-3F may perform one or more functions described herein as being performed by another set of components.

FIGS. 4A-4E are diagrams of an example implementation 400 described herein. FIGS. 4A-4E show structures, layers, and/or other components associated with an electronic device (e.g., an integrated circuit device, a semiconductor device) manufactured on a semiconductor wafer 104 during processing in the semiconductor processing environment 100 of FIGS. 1A-1C. Within the semiconductor processing environment 100, the semiconductor wafer 104 may be transported using a transport carrier (e.g., the transport carrier 106) and stationed on a load port (e.g., the load port 108). As part of manufacturing the device, an interface tool (e.g., the interface tool 102) may transfer the semiconductor wafer 104 to one or more processing tools (e.g., the processing tool 110), such as a deposition tool.

Figure 4A:
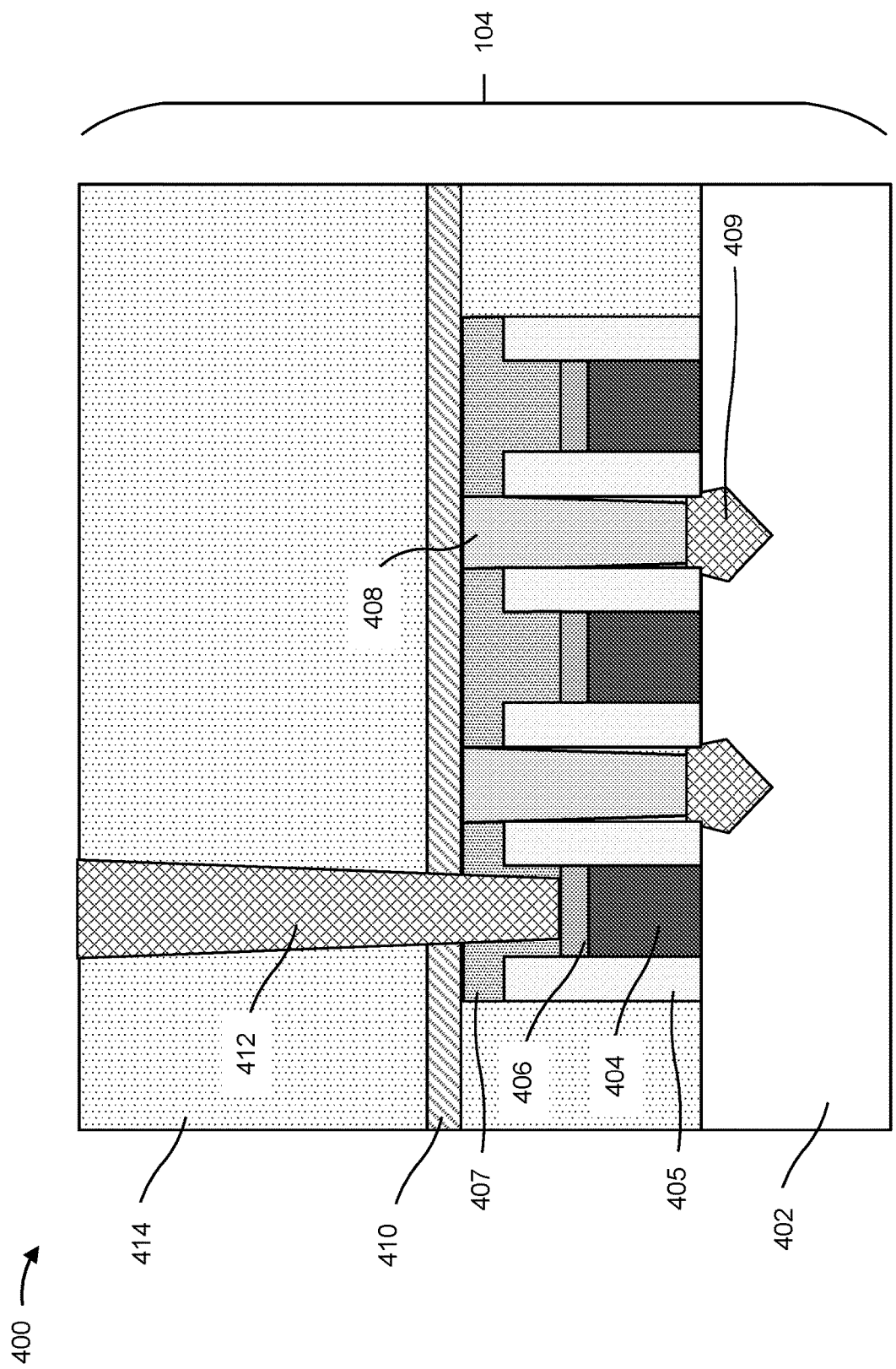

As shown in FIG. 4A, the device on the semiconductor wafer 104 includes multiple structures that are manufactured as part of a device on a substrate 402. Through a combination of semiconductor manufacturing steps that may include chemical mechanical polishing/planarization (CMP), photolithography, and etching (e.g., dry etching and/or wet etching), the device may be manufactured to include a metal gate structure 404, sidewall spacers 405, a metal gate (MG) cap 406, and a self-aligned contact (SAC) capping layer 407. The device may also include a metal source/drain contact (MD) structure 408 that is electrically connected to a source/drain region 409 and an etch stop layer (ESL) 410.

In some implementations, the metal gate structure 404 includes a metal material, a high-k material, and/or another suitable material. The metal gate structure 404 includes a conductive metallic material (or metal alloy) such as cobalt (Co), tungsten (W), ruthenium (Ru), molybdenum (Mo), titanium (Ti), titanium nitride (TiN), another metallic material, and/or a combination thereof. The sidewall spacers 405 are included to electrically isolate the metal gate structure 404 from adjacent conductive structures included on the device, and thus may be referred to as gate spacers. The sidewall spacers 405 include a silicon oxide ($SiO_x$), a silicon nitride (SixNy), a silicon oxy carbide (SiOC), a silicon oxycarbonitride (SiOCN), and/or another suitable material.

In some implementations, the MG cap 406 is included to protect the metal gate structure 404 from oxidization and/or etch damage during processing of the device, which preserves the low contact resistance of the metal gate structure 404. The MG cap 406 may include a conductive metallic material (or metal alloy) such as cobalt (Co), tungsten (W), ruthenium (Ru), molybdenum (Mo), titanium (Ti), titanium nitride (TiN), another metallic material, and/or a combination thereof. The dielectric capping layer 218 includes a dielectric material such as a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), and/or a zinc oxide ($Zn_xO_y$), among other examples.

The SAC capping layer 407 protects the metal gate structure 404 from processing damage during processing of the device. In some implementations, the SAC capping layer 407 includes a dielectric material such as a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), and/or a zinc oxide ($Zn_xO_y$), among other examples.

In some implementations the MD structure 408 includes a metal material (e.g., cobalt, ruthenium, or copper, among other examples). Furthermore, and as shown in FIG. 4A, the device includes a gate interconnect structure 412 that passes through a dielectric layer 414.

Figure 4B:
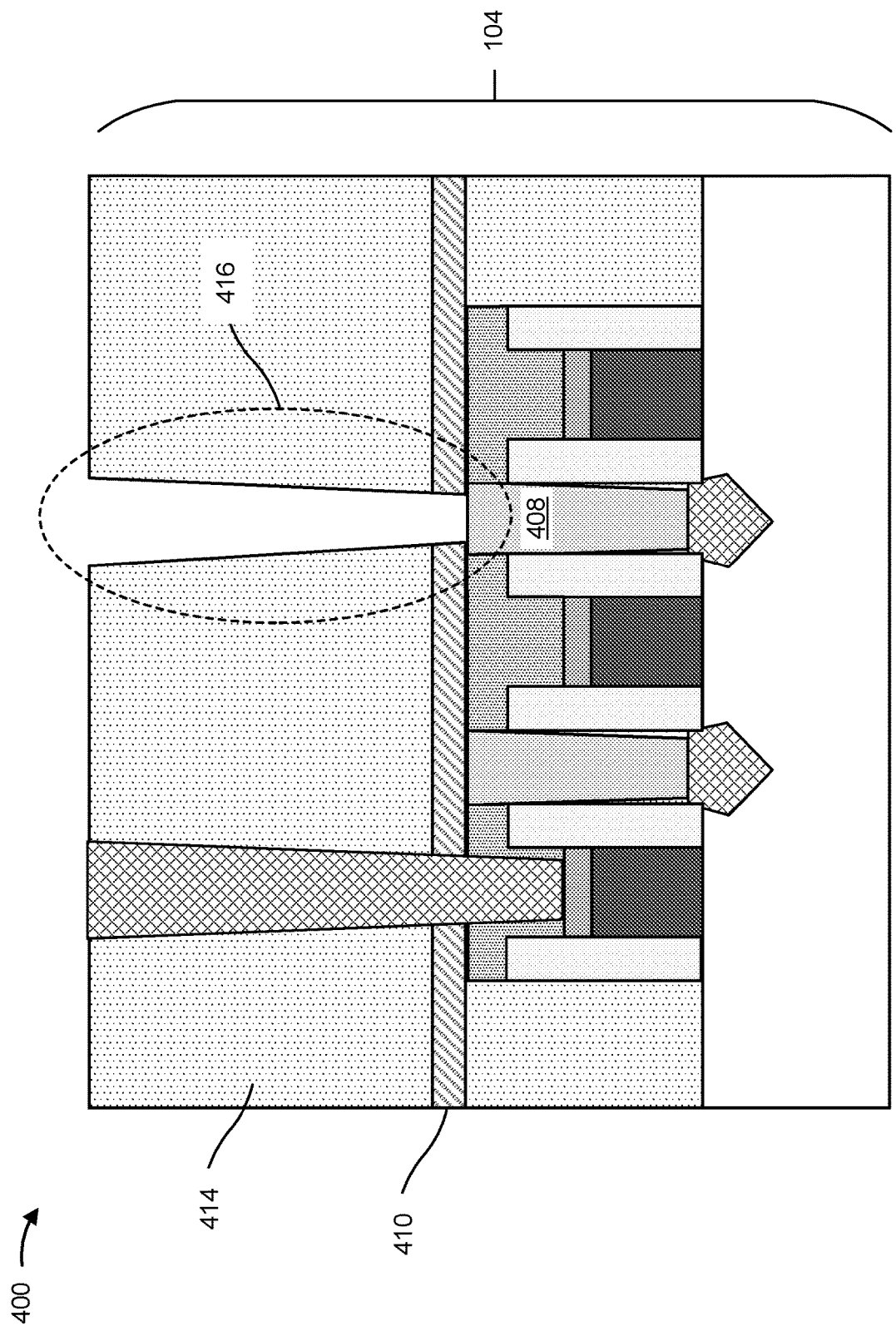

Turning to FIG. 4B, additional manufacturing steps (e.g., photolithography manufacturing steps, dry etching manufacturing steps, wet cleaning steps, among other examples) form an opening 416 in the dielectric layer 414 and in the ESL 410. In some implementations, the opening 416 is formed in preparation for forming a metal source/drain interconnect structure in the opening 416 to the MD structure 408.

Figure 4C:
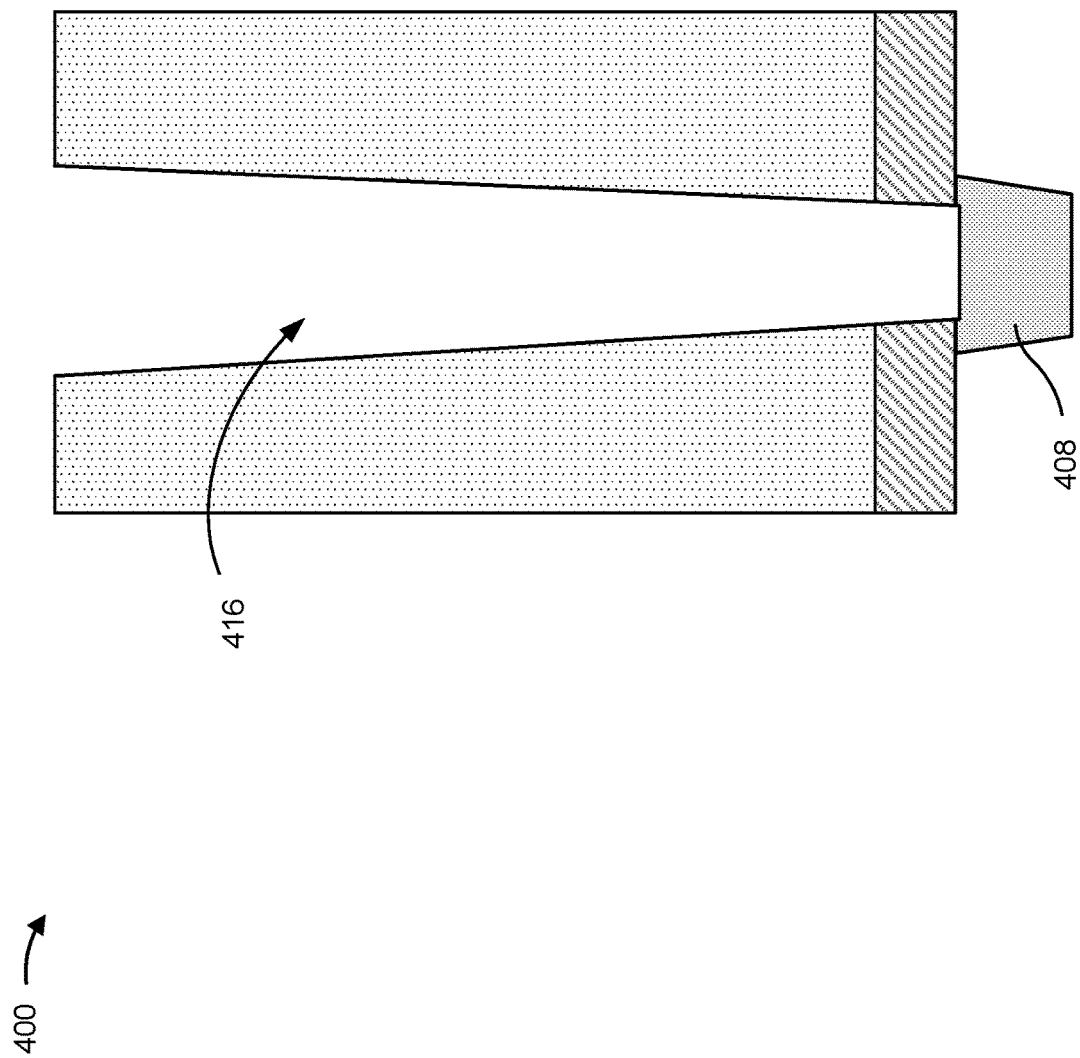

FIG. 4C shows the device in preparation for a deposition process. Within the opening 416, a surface of the MD structure 408 may be exposed. During a deposition process by a processing tool, (e.g., a physical vapor deposition (PVD) process or a chemical vapor deposition process by the processing tool 110 of FIGS. 1A-1C), moisture on the exposed surface of the MD structure 408 may cause corrosion. Accordingly, the gas curtain system 126 described herein may maintain a relative low humidity of an environment within a transport carrier containing the semiconductor wafer 104 (e.g., maintain the relative low humidity of the environment 120 of the transport carrier 106 containing the semiconductor wafer 104) to prevent moisture from condensing on the exposed surface of the MD structure 408 prior to the semiconductor wafer being transferred from the transport carrier to the processing tool. In this way, the corrosion may be prevented (or the likelihood of the corrosion occurring may be reduced or minimized).

Figure 4D:
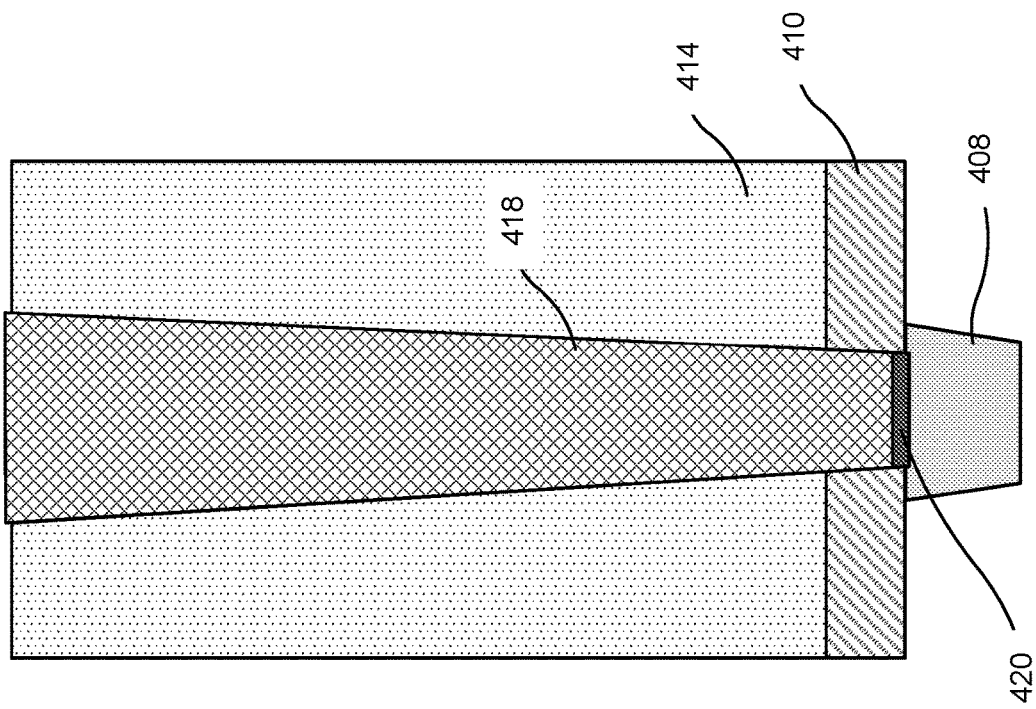

FIG. 4D shows the device after deposition manufacturing processes and without corrosion. As shown, the device includes a metal source/drain interconnect structure 418 that is formed through the dielectric layer 414 and the etch stop layer 410. In some implementations, and as shown in FIG. 4D, the device includes a metal cap 420.

Figure 4E:
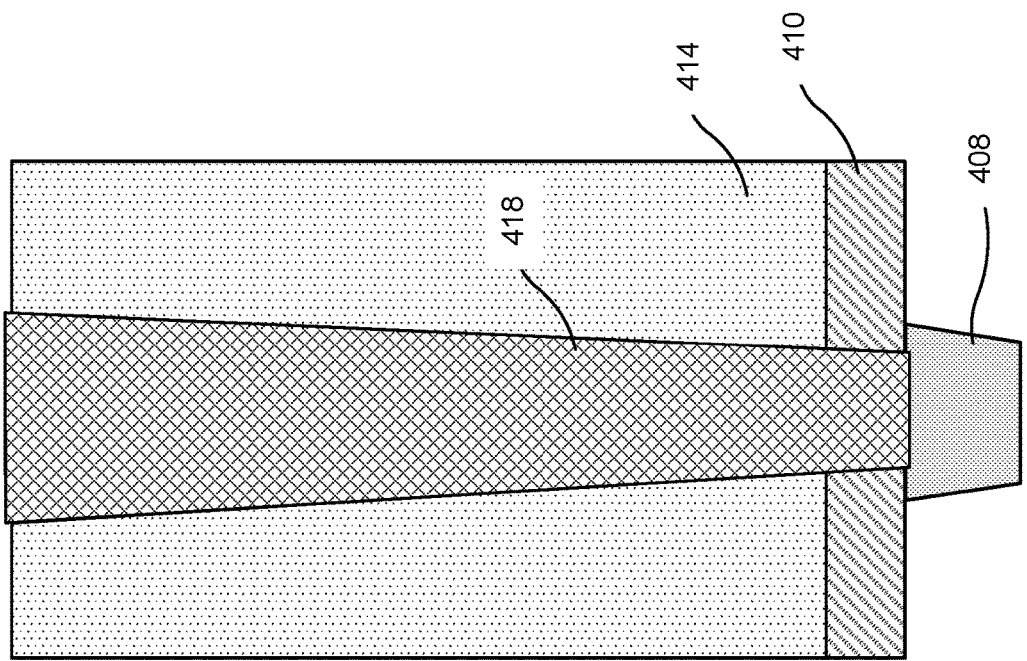

FIG. 4E shows an alternative embodiment to FIG. 4D in which the metal cap 420 is omitted from the device. Here, the metal source/drain interconnect structure 418 is in direct contact with the MD structure 408.

As indicated above, FIGS. 4A-4E are provided as examples. Other examples may differ from what is described with regard to FIGS. 4A-4E. For example, another example may include additional structures, fewer structures, different structures or differently arranged structures than those shown in FIGS. 4A-4E. Additionally, or one or more semiconductor wafer manufacturing processes or devices other than those described in FIGS. 4A-4E may receive the benefits of a gas curtain system (e.g., the gas curtain system 126).

FIG. 5 is a diagram of example components of one or more devices of FIGS. 1A-1C. FIG. 5 includes example device 500, which may correspond to the interface tool 102, the transport carrier 106, the load port 108, the processing tool 110, the transport tool 118, the gas curtain system 126, and/or the controller 130. In some implementations, the interface tool 102, the transport carrier 106, the load port 108, the processing tool 110, the transport tool 118, the gas curtain system 126, and/or the controller 130 may include one or more devices 500 and/or one or more components of device 500. As shown in FIG. 5, device 500 may include a bus 510, a processor 520, a memory 530, an input component 540, an output component 550, and a communication component 560.

Bus 510 includes one or more components that enable wired and/or wireless communication among the components of device 500. Bus 510 may couple together two or more components of FIG. 5, such as via operative coupling, communicative coupling, electronic coupling, and/or electric coupling. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform one or more operations or processes described elsewhere herein.

Memory 530 includes volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 includes one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry may be used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
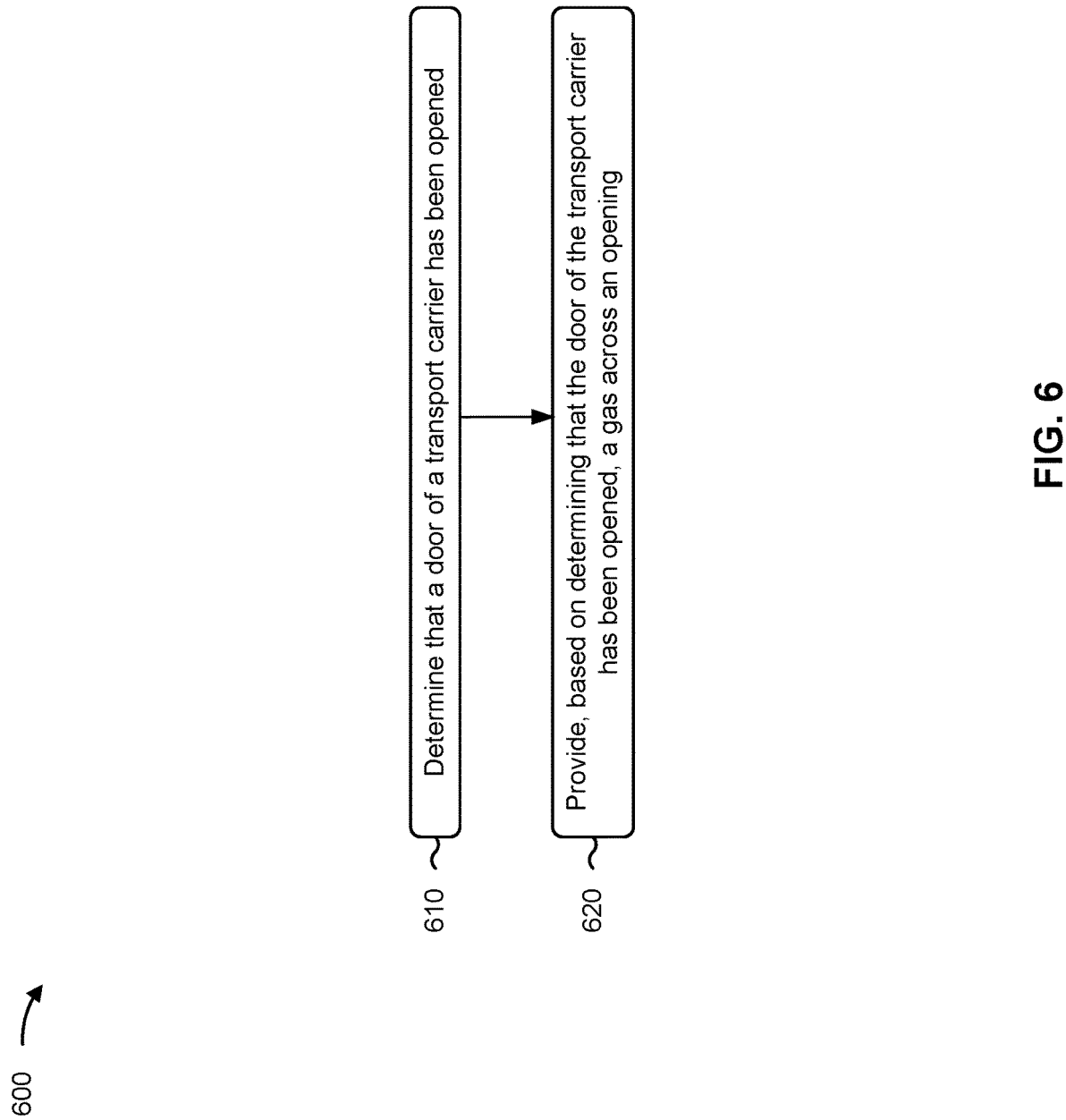
FIGS. 6 and 7 are flowcharts example processes relating to operating a gas curtain system described herein.

FIG. 6 is a flowchart of an example process 600 relating to operating the gas curtain system 126 described herein. In some implementations, one or more process blocks of FIG. 6 are performed by a controller (e.g., the controller 130) and/or a gas curtain system (e.g., gas curtain system 126). In some implementations, one or more process blocks of FIG. 6 are performed by another device or a group of devices separate from or including the controller 130 and/or the gas curtain system 126, such as the interface tool 102, the transport carrier 106, the load port 108, the processing tool 110, or the transport tool 118. Additionally, or alternatively, one or more process blocks of FIG. 6 may be performed by one or more components of device 500, such as processor 520, memory 530, input component 540, output component 550, and/or communication component 560.

As shown in FIG. 6, process 600 may include determining that a door of a transport carrier has been opened (block 610). For example, the controller 130 may determine that a door 124 of a transport carrier 106 has been opened. In some implementations, the transport carrier 106 is located on the load port 108 and interfaced with an opening 122 in a side of a chamber 112 of an interface tool 102. In some implementations, a first gas (e.g., gas 146) having a first amount of moisture content 148 and provided by a first gas system (e.g., gas system 144) of the load port 108 circulates within the transport carrier 106.

As further shown in FIG. 6, process 600 may include providing, based on determining that the door of the transport carrier has been opened, a second gas across an opening (block 620). For example, based on the controller 130 determining that the door 124 of the transport carrier 106 has been opened, the gas curtain system 126 may provide a second gas (e.g., gas 128) across the opening 122. In some implementations, the second gas originates along a first approximate edge 162 of the opening 122 and flows across the opening 122 in an approximately linear path towards a second approximate edge 164 of the opening 122 that is opposite the first approximate edge 162, and reduces a likelihood of a third gas (e.g., gas 132) flowing within an interface tool 102 and having a second amount of moisture content 142 that is greater than the first amount of moisture content 148, from entering the transport carrier 106 and mixing with the first gas so that a relative humidity of an environment 120 within the transport carrier 106 satisfies a threshold 204-2.

Process 600 may include additional implementations, such as any single implementation or any combination of implementations described below and/or in connection with one or more other processes described elsewhere herein.

In a first implementation, the first gas or the second gas includes an extra clean dry air gas or a nitrogen gas.

In a second implementation, alone or in combination with the first implementation, the threshold is in a range of approximately 0.0% to approximately 0.5%.

In a third implementation, alone or in combination with one or more of the first and second implementations, the flow of the second gas is an approximately laminar flow.

In a fourth implementation, alone or in combination with one or more of the first through third implementations, a second gas system (e.g., gas system 126) provides the second gas across the opening 122 at a flow rate that is in a range of approximately 325 liters per minute to approximately 375 liters per minute.

In a fifth implementation, alone or in combination with one or more of the first through fourth implementations, the second gas system provides the second gas across the opening 122 at pressure that is in a range of approximately 3 kilopascal to 5 kilopascal.

In a sixth implementation, alone or in combination with one or more of the first through fifth implementations, the second gas includes a total organic carbon content that is in a range of approximately 1 part per billion to approximately 10 parts per billion.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
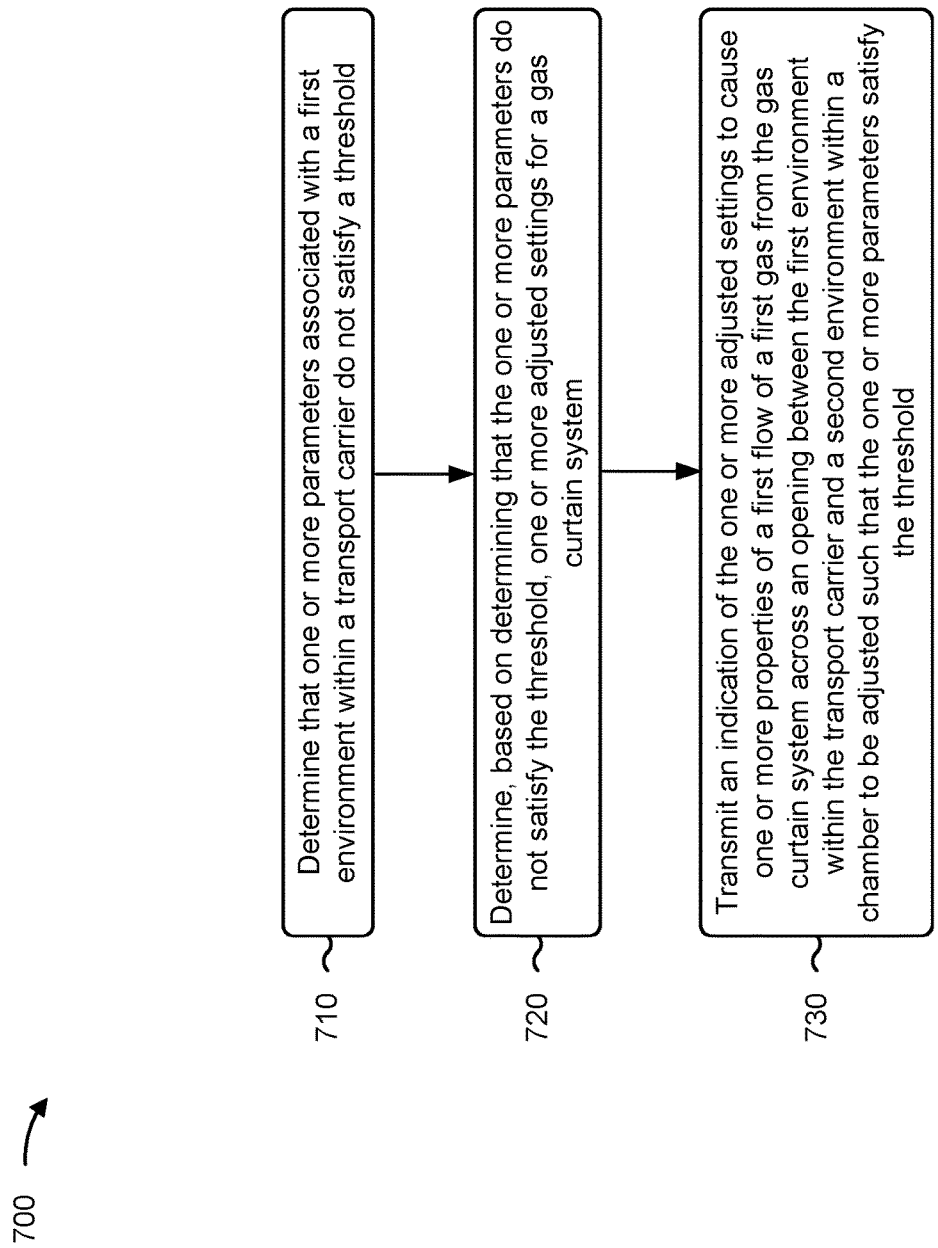

FIG. 7 is a flowchart of an example process 700 relating to operating the gas curtain system 126 described herein. In some implementations, one or more process blocks of FIG. 7 are performed by a controller (e.g., the controller 130). In some implementations, one or more process blocks of FIG. 7 are performed by another device or a group of devices separate from or including the controller 130, such as the interface tool 102, the transport carrier 106, the load port 108, the processing tool 110, the transport tool 118, or components of the gas curtain system 126. Additionally, or alternatively, one or more process blocks of FIG. 7 may be performed by one or more components of device 500, such as processor 520, memory 530, input component 540, output component 550, and/or communication component 560.

As shown in FIG. 7, process 700 may include determining that one or more parameters associated with a first environment within a transport carrier do not satisfy a threshold (block 710). For example, the controller 130 may determine that one or more parameters associated with a first environment 120 within a transport carrier 106 do not satisfy a threshold. In some implementations, the transport carrier 106 is positioned on a load port 108 adjacent to a chamber 112 of an interface tool 102.

As further shown in FIG. 7, process 700 may include determining, based on determining that the one or more parameters do not satisfy the threshold, one or more adjusted settings for a gas curtain system (block 720). For example, the controller 130 may determine, based on determining that the one or more parameters do not satisfy the threshold, one or more adjusted settings for a gas curtain system 126 included in the interface tool 102, as described above.

As further shown in FIG. 7, process 700 may include transmitting an indication of the one or more adjusted settings to cause one or more properties of a first flow of a first gas from the gas curtain system across an opening between the first environment within the transport carrier and a second environment within the chamber to be adjusted such that the one or more parameters satisfy the threshold (block 730). For example, the controller 130 may transmit an indication (e.g., the signal 152 including an indication) of the one or more adjusted settings to cause one or more properties of a first flow of a first gas (e.g., gas 128) from the gas curtain system 126 across an opening 122 between the first environment 120 within the transport carrier and a second environment 114 within the chamber 112 to be adjusted such that the one or more parameters satisfy the threshold. In some implementations, the first flow of the first gas from the gas curtain system 126 impedes a second flow of a second gas (e.g., gas 132) from transferring from the second environment 114 within the chamber 112 to the first environment 120 within the transport carrier 106 to prevent an increase in humidity in the first environment 120 within the transport carrier 106.

Process 700 may include additional implementations, such as any single implementation or any combination of implementations described below and/or in connection with one or more other processes described elsewhere herein.

In a first implementation, transmitting the indication of the one or more adjusted settings includes transmitting the indication to a gas source component 156 of the gas curtain system 126 to cause an adjustment to a setting for controlling a mixture of the first gas.

In a second implementation, alone or in combination with the first implementation, transmitting the indication of the one or more adjusted settings includes transmitting the indication to a flow-rate component 174 of the gas curtain system 126 to cause an adjustment to a setting for controlling a flow rate of the first gas.

In a third implementation, alone or in combination with one or more of the first and second implementations, transmitting the indication of the one or more adjusted settings includes transmitting the indication to a heater component 176 of the gas curtain system 126 to cause an adjustment to a setting for controlling a temperature of the first gas.

In a fourth implementation, alone or in combination with one or more of the first through third implementations, transmitting the indication of the one or more adjusted settings includes transmitting the indication to a motor component 178 of the gas curtain system 126 that is mechanically coupled to a directional guide component 160 of a gas distribution component 158 to cause an adjustment to a setting for controlling an angle or distribution profile of the first gas from the gas distribution component 158 across the opening 122.

In a fifth implementation, alone or in combination with one or more of the first through fourth implementations, process 700 includes transmitting, by the controller 130, an indication of one or more adjusted settings to cause a change to a velocity at which a transport tool 118 transports a semiconductor wafer 104 through the opening 122 and through the first flow of the first gas, where the transport tool 118 transports the semiconductor wafer 104 through the opening 122 and through the first flow of the first gas as part of a transfer process between the transport carrier 106 and a processing tool 110.

In a sixth implementation, alone or in combination with one or more of the first through fifth implementations, process 700 includes transmitting, by the controller 130, an indication (e.g., the signal 152 including an indication) to cause the interface tool 102 to output, to a user of the interface tool 102, a notification indicating a status of the gas curtain system 126.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Some implementations described herein provide a gas curtain system. The gas curtain system includes various components to prevent a gas flowing within a chamber of an interface tool from flowing through an opening into a transport carrier adjacent to the interface tool. The gas curtain system may include a gas distribution component along an edge of the opening that generates a flow of another gas across the opening towards an opposite edge of the opening. In this way, the gas from the chamber is prevented from entering the transport carrier. By preventing the gas from the chamber from entering the transport carrier, a relative humidity within an environment of the transport carrier is maintained such that condensation of moisture on one or more semiconductor wafers within the transport carrier is mitigated. Subsequently, corrosion on the one or more semiconductor wafers during processing by a processing tool is prevented.

As described in greater detail above, some implementations described herein provide a method. The method includes determining, by an interface tool, that a door of a transport carrier has been opened, where the transport carrier is located on a load port and interfaced with an opening in a side of a chamber of the interface tool, and where a first gas having a first amount of moisture content and provided by a first gas system of the load port circulates within the transport carrier. The method includes providing, by a second gas system of the interface tool based on determining that the door of the transport carrier has been opened, a second gas across the opening, where the second gas: originates along a first approximate edge of the opening and flows across the opening in an approximately linear path towards a second approximate edge of the opening that is opposite the first approximate edge, and reduces a likelihood of a third gas, flowing within the chamber of the interface tool and having a second amount of moisture content that is greater than the first amount of moisture content, from entering the transport carrier and mixing with the first gas so that a relative humidity of an environment within the transport carrier satisfies a threshold.

As described in greater detail above, some implementations described herein provide an interface tool. The interface tool includes a load port configured to provide a first flow of a first gas through an inlet diffuser to a transport carrier positioned on the load port. The interface tool includes a chamber that has an opening, in a side of the chamber, configured to be orientated toward the transport carrier. The interface tool includes an aligner positioned within the chamber. The interface tool includes a fan filter unit. The interface tool includes a gas distribution component along an approximate edge of the opening that is configured to provide a second flow of a second gas across the opening, block a third flow of a third gas originating from the fan filter unit and deflected towards the opening by the aligner to: impede moisture from accumulating on a semiconductor wafer positioned in the transport carrier due to the third gas mixing with the first gas within the transport carrier, and reduce a likelihood of corrosion forming on the semiconductor wafer during processing of the semiconductor wafer by a processing tool configured to receive the semiconductor wafer from the interface tool.

As described in greater detail above, some implementations described herein provide a method. The method includes determining, by a controller, that one or more parameters associated with a first environment within a transport carrier do not satisfy a threshold, where the transport carrier is positioned on a load port adjacent to a chamber of an interface tool. The method includes determining, by the controller and based on determining that the one or more parameters do not satisfy the threshold, one or more adjusted settings for a gas curtain system included in the interface tool. The method includes transmitting, by the controller, an indication of the one or more adjusted settings to cause one or more properties of a first flow of a first gas from the gas curtain system across an opening between the first environment within the transport carrier and a second environment within the chamber to be adjusted such that the one or more parameters satisfy the threshold, where the first flow of the first gas from the gas curtain system impedes a second flow of a second gas from transferring from the second environment within the chamber to the first environment within the transport carrier to prevent an increase in humidity in the first environment within the transport carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    determining, by an interface tool, that a door of a transport carrier has been opened,
        wherein the transport carrier is located on a load port and interfaced with an opening in a side of a chamber of the interface tool, and
        wherein a first gas having a first amount of moisture content and provided by a first gas system of the load port circulates within the transport carrier;
    providing, by a second gas system of the interface tool based on determining that the door of the transport carrier has been opened, a flow of a second gas across the opening,
        wherein the second gas:
            originates along a first approximate edge of the opening and flows across the opening in an approximately linear path towards a second approximate edge of the opening that is opposite the first approximate edge, and
            reduces a likelihood of a third gas, flowing within the chamber of the interface tool and having a second amount of moisture content that is greater than the first amount of moisture content, from entering the transport carrier and mixing with the first gas so that a relative humidity of an environment within the transport carrier satisfies a threshold; and
    determining, by the interface tool, that a semiconductor wafer is co-located with the flow of the second gas provided across the opening;
    determining, by the interface tool and based on determining that the semiconductor wafer is co-located with the flow of the second gas provided across the opening, to adjust a setting of one or more components of a gas curtain system; and
    transmitting, based on determining to adjust the setting of the one or more components of the gas curtain system, an indication to cause an adjustment to the setting of the one or more components.

2. The method of claim 1, wherein the first gas or the second gas comprises an extra clean dry air gas or a nitrogen gas.

3. The method of claim 1, wherein the threshold is in a range of approximately 0.0% to approximately 0.5%.

4. The method of claim 1, wherein the flow of the second gas is an approximately laminar flow.

5. The method of claim 1, wherein the second gas system provides the flow of the second gas across the opening at a flow rate that is in a range of approximately 325 liters per minute to approximately 375 liters per minute.

6. The method of claim 1, wherein the second gas system provides the second gas across the opening at pressure that is in a range of approximately 3 kilopascal to 5 kilopascal.

7. The method of claim 1, wherein the second gas comprises a total organic carbon content that is in a range of approximately 1 part per billion to approximately 10 parts per billion.

8. An interface tool, comprising:
    a load port configured to provide a first flow of a first gas through an inlet diffuser to a transport carrier positioned on the load port;
    a chamber, comprising an opening in a side of the chamber, that is configured to be orientated toward the transport carrier;
    an aligner positioned within the chamber;
    a fan filter unit;
    a gas distribution component, along an approximate edge of the opening, that is configured to provide a second flow of a second gas across the opening to:
        block a third flow of a third gas originating from the fan filter unit and deflected towards the opening by the aligner to:
            impede moisture from accumulating on a semiconductor wafer positioned in the transport carrier due to the third gas mixing with the first gas within the transport carrier, and
            reduce a likelihood of corrosion forming on the semiconductor wafer during processing of the semiconductor wafer by a processing tool configured to receive the semiconductor wafer from the interface tool; and
    a controller configured to:
        receive, from one or more sensors, first sensor data associated with the semiconductor wafer being co-located with the second flow of the second gas across the opening;
        determine, based on the first sensor data, to adjust a setting of one or more components of a gas curtain system including the gas distribution component; and
        transmit, based on determining to adjust the setting of the one or more components of the gas curtain system, an indication to cause an adjustment to the setting of the one or more components.

9. The interface tool of claim 8, wherein the gas distribution component is included as part of a gas curtain system that includes one or more components;
    wherein the one or more components include at least one of:
        a gas source component,
        a flow-rate component,
        a heater component, or
        a motor component; and
    wherein the motor component is mechanically coupled to a directional guide component of the gas distribution component.

10. The interface tool of claim 8, wherein the controller is further configured to:
receive, from the one or more sensors, second sensor data associated with a position of a door of the transport carrier;
determine, based on the second sensor data, that the door of the transport carrier is in an open position; and
transmit, based on determining that the door of the transport carrier is in the open position, an indication to activate the gas curtain system.

11. The interface tool of claim 8, wherein the controller is further configured to:
receive, from a first sensor of the one or more sensors, second sensor data associated with a first relative humidity of a first environment within the transport carrier; and
receive, from a second sensor of the one or more sensors, third sensor data associated with a second relative humidity of a second environment within the chamber, and
wherein the setting of the one or more components of the gas curtain system is further determined to be adjusted based on the second sensor data and the third sensor data.

12. The interface tool of claim 8, wherein the controller is further configured to:
determine, based on the first sensor data, a correlation between a relative humidity of an environment within the transport carrier and one or more settings of one or more other components of the gas curtain system; and
provide information relating to the correlation to update a machine-learning model to estimate the relative humidity of the environment within the transport carrier for different settings of the one or more other components of the gas curtain system.

13. The interface tool of claim 8, wherein the one or more sensors and the gas distribution component are of a gas curtain system located adjacent to the opening.

14. A method, comprising:
determining, by a controller, that one or more parameters associated with a first environment within a transport carrier do not satisfy a threshold,
wherein the transport carrier is positioned on a load port adjacent to a chamber of an interface tool;
determining, by the controller and based on determining that the one or more parameters do not satisfy the threshold, one or more adjusted settings for a gas curtain system included in the interface tool; and
transmitting, by the controller, an indication of the one or more adjusted settings to cause one or more properties of a first flow of a first gas from the gas curtain system across an opening between the first environment within the transport carrier and a second environment within the chamber to be adjusted such that the one or more parameters satisfy the threshold,
wherein the first flow of the first gas from the gas curtain system impedes a second flow of a second gas from transferring from the second environment within the chamber to the first environment within the transport carrier to prevent an increase in humidity in the first environment within the transport carrier, and
wherein transmitting the indication of the one or more adjusted settings comprises transmitting the indication to a motor component of the gas curtain system that is mechanically coupled a directional guide component of a gas distribution component to cause an adjustment to a setting for controlling an angle or distribution profile of the first gas from the gas distribution component across the opening, wherein the directional guide component comprises one or more of a baffle, a port, a rectifier, and/or a vent.

15. The method of claim 14, wherein transmitting the indication of the one or more adjusted settings comprises:
transmitting the indication to a gas source component of the gas curtain system to cause an adjustment to a setting for controlling a mixture of the first gas with another gas.

16. The method of claim 14, wherein transmitting the indication of the one or more adjusted settings comprises:
transmitting the indication to a flow-rate component of the gas curtain system to cause an adjustment to a setting for controlling a flow rate of the first gas.

17. The method of claim 14, wherein transmitting the indication of the one or more adjusted settings comprises:
transmitting the indication to a heater component of the gas curtain system to cause an adjustment to a setting for controlling a temperature of the first gas.

18. The method of claim 14, further comprising:
transmitting, by the controller, an indication of one or more adjusted settings to cause a change to a velocity at which a transport tool transports a semiconductor wafer through the opening and through the first flow of the first gas,
wherein the transport tool transports the semiconductor wafer through the opening and through the first flow of the first gas as part of a transfer process between the transport carrier and a processing tool.

19. The method of claim 14, further comprising:
transmitting, by the controller, an indication to cause the interface tool to output, to a user of the interface tool, a notification indicating a status of the gas curtain system.

20. The method of claim 14, wherein the threshold is in a range of approximately 0.0% to approximately 0.5%.

* * * * *